US012381141B2

(12) United States Patent
Lin et al.

(10) Patent No.: US 12,381,141 B2
(45) Date of Patent: Aug. 5, 2025

(54) SEMICONDUCTOR DEVICE AND METHOD OF FORMING HYBRID SUBSTRATE WITH UNIFORM THICKNESS

(71) Applicant: STATS ChipPAC Pte. Ltd., Singapore (SG)

(72) Inventors: Yaojian Lin, Jiangsu Province (CN); Linda Pei Ee Chua, Singapore (SG); Jian Zuo, Singapore (SG); Hin Hwa Goh, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 514 days.

(21) Appl. No.: 17/823,827

(22) Filed: Aug. 31, 2022

(65) Prior Publication Data

US 2024/0071885 A1     Feb. 29, 2024

(51) Int. Cl.
*H01L 23/48* (2006.01)
*H01L 21/48* (2006.01)
(Continued)

(52) U.S. Cl.
CPC .... *H01L 23/49833* (2013.01); *H01L 21/4857* (2013.01); *H01L 21/486* (2013.01);
(Continued)

(58) Field of Classification Search
CPC ........... H01L 23/49833; H01L 21/4857; H01L 21/486; H01L 23/49816; H01L 23/49822; H01L 23/49838; H01L 23/49894; H01L 24/16; H01L 25/16; H01L 2224/16227; H01L 2224/16238; H01L 2924/3511; H01L 23/642; H01L 23/645; H01L 25/105; H01L 25/50; H01L 23/49827; H01L 23/3128; H01L 21/56; H01L 21/76831;
(Continued)

(56) References Cited

U.S. PATENT DOCUMENTS 9,257,384 B2 *   2/2016   Park .................. H01L 23/49833
9,818,635 B2    11/2017   Chen et al.
(Continued)

FOREIGN PATENT DOCUMENTS

CN         113161333 A        7/2021

*Primary Examiner* — Theresa T Doan
(74) *Attorney, Agent, or Firm* — Robert D. Atkins; PATENT LAW GROUP: Atkins and Associates, P.C.

(57) ABSTRACT

A semiconductor device has a first hybrid substrate with a first thickness, and a second hybrid substrate with a second thickness different from the first thickness of the first hybrid substrate. An encapsulant is deposited around the first hybrid substrate and second hybrid substrate. A portion of the first hybrid substrate and a portion of the second hybrid substrate and a portion of the encapsulant can be removed after encapsulation to achieve uniform thickness for the first hybrid substate and second hybrid substrate. The first hybrid substrate has an embedded substrate, a first interconnect structure formed over a first surface of the embedded substrate, and a second interconnect structure formed over a second surface of the embedded substrate opposite the first surface of the embedded substrate. A plurality of conductive pillars is formed over the first interconnect structure. A plurality of conductive vias is formed through the embedded substrate.

25 Claims, 30 Drawing Sheets

(51) Int. Cl.
 *H01L 23/00* (2006.01)
 *H01L 23/498* (2006.01)
 *H01L 25/16* (2023.01)

(52) U.S. Cl.
 CPC .. *H01L 23/49816* (2013.01); *H01L 23/49822* (2013.01); *H01L 23/49838* (2013.01); *H01L 23/49894* (2013.01); *H01L 24/16* (2013.01); *H01L 25/16* (2013.01); H01L 2224/16227 (2013.01); H01L 2224/16238 (2013.01); *H01L 2924/3511* (2013.01)

(58) Field of Classification Search
 CPC ............... H01L 23/481; H01L 23/5283; H01L 21/76898; H01L 23/5226; H01L 23/5329; H10D 1/20; H10D 1/47; H10D 1/68
 USPC ........................................................ 257/690
 See application file for complete search history.

(56) References Cited

U.S. PATENT DOCUMENTS

| | | | |
|---|---|---|---|
| 2013/0187266 A1* | 7/2013 | Chen | ..................... H01L 24/81 257/737 |
| 2021/0159177 A1 | 5/2021 | Tsai et al. | |
| 2021/0217707 A1 | 7/2021 | Tsai et al. | |

* cited by examiner

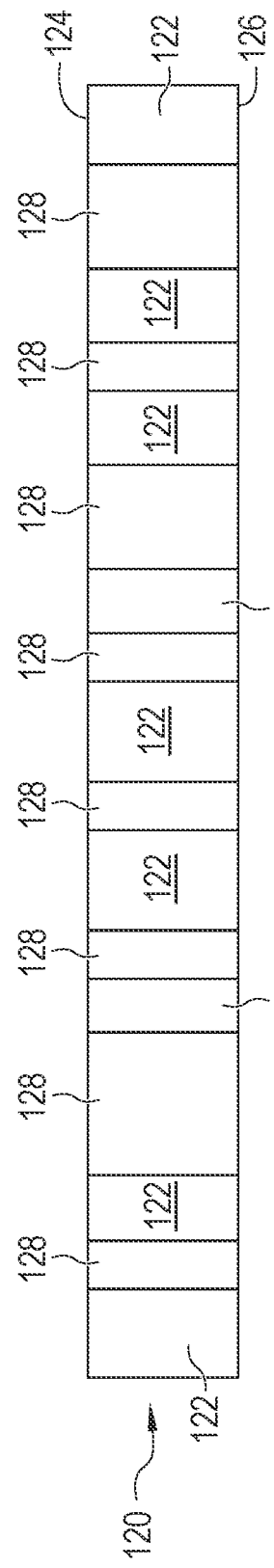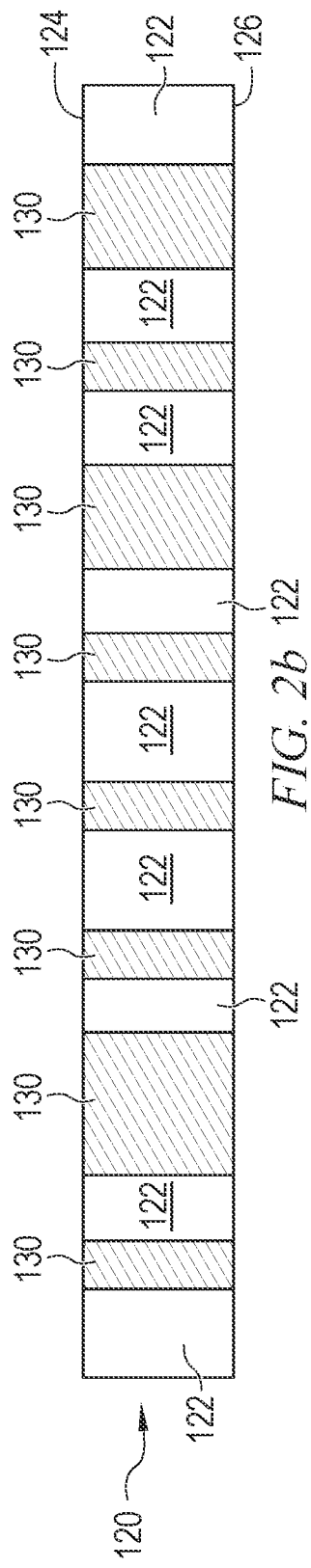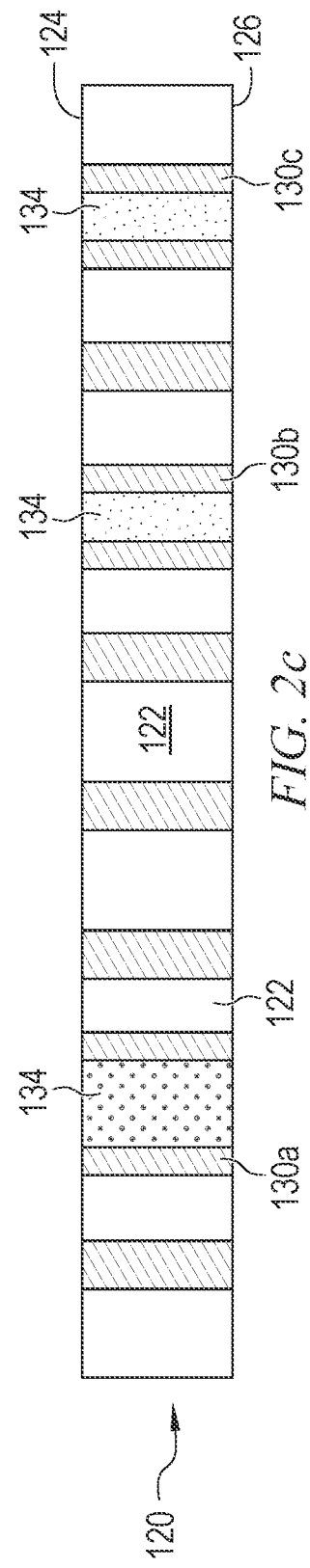

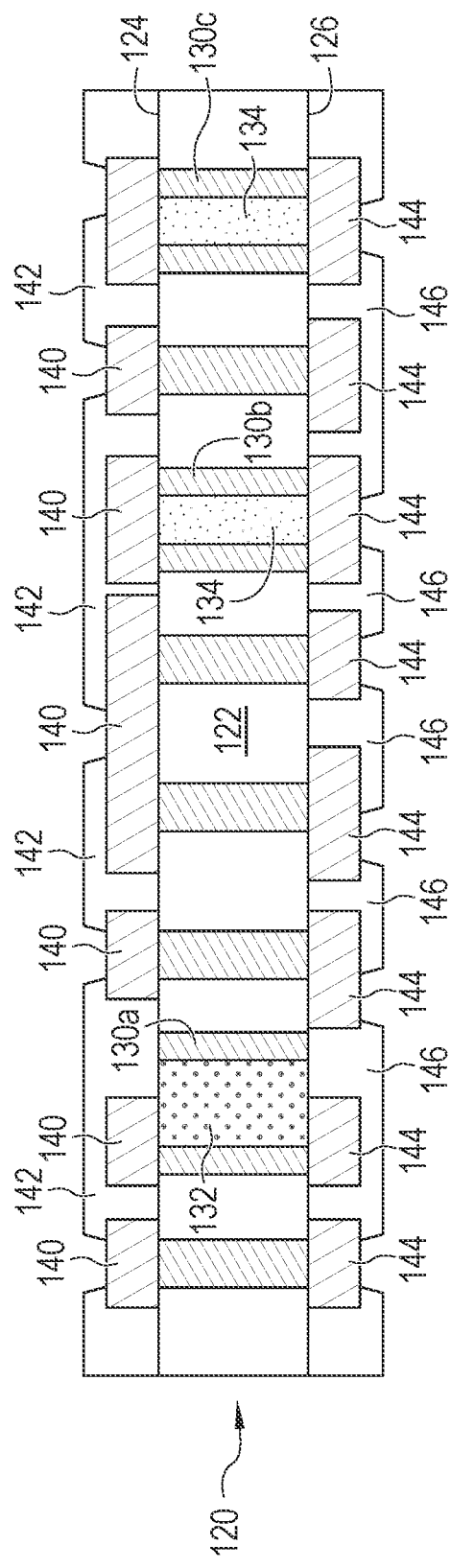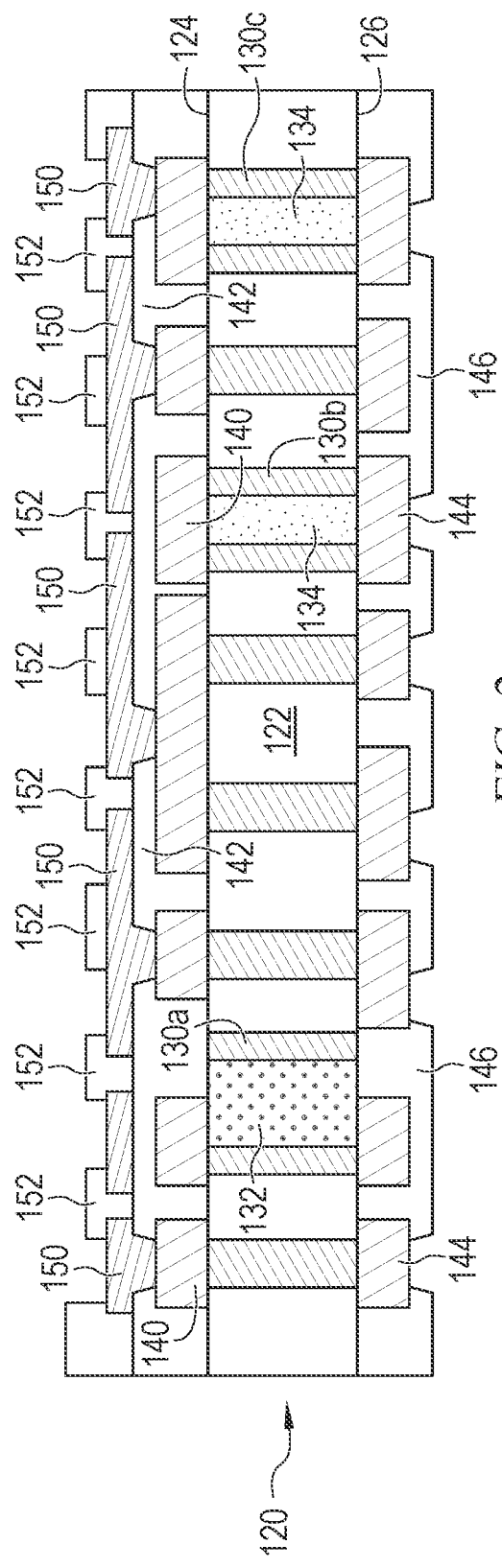

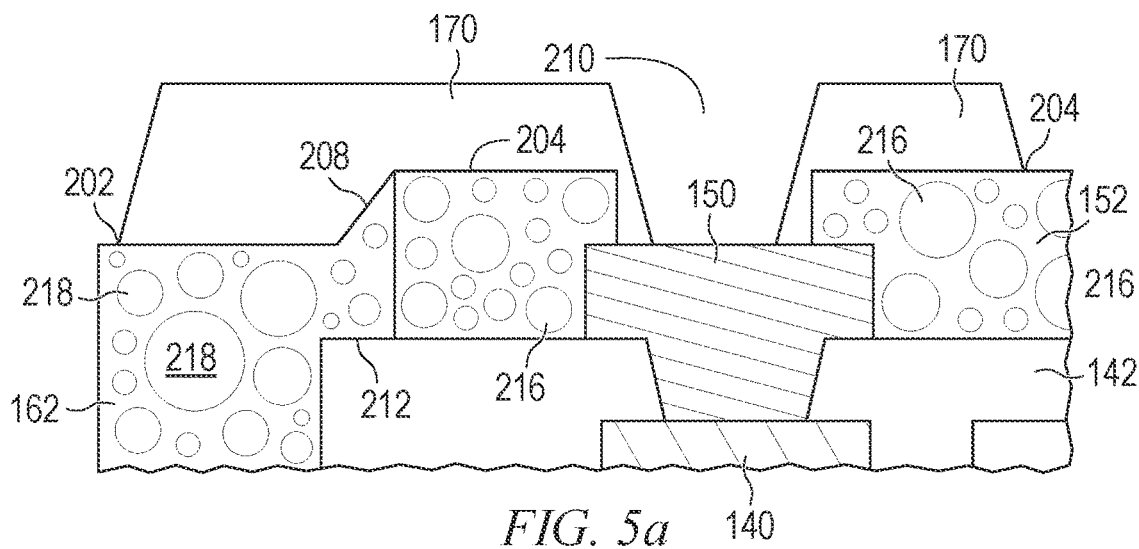
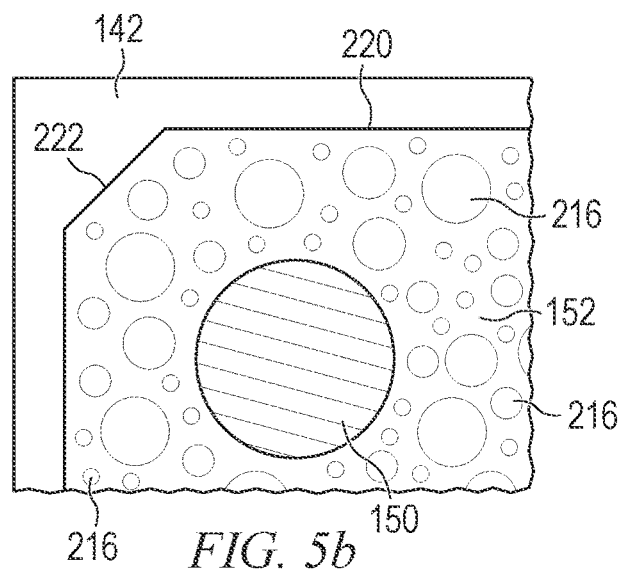
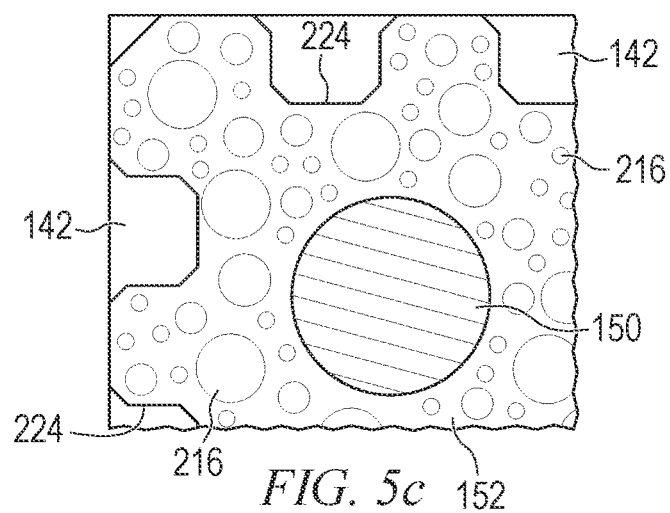

SEMICONDUCTOR DEVICE AND METHOD OF FORMING HYBRID SUBSTRATE WITH UNIFORM THICKNESS

FIELD OF THE INVENTION

The present invention relates in general to semiconductor devices and, more particularly, to a semiconductor device and method of forming a hybrid substrate to have uniform thickness.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices often contain a semiconductor die or substrate with electrical interconnect structures formed over opposing surfaces of the semiconductor die or substrate to perform necessary electrical functions. The semiconductor device is subject to variation in terms of the thickness or height of the semiconductor device during manufacturing, particularly with multiple interconnect layers, conductive pillars, and other structures. The variation in thickness of similar semiconductor devices can be 20 micrometers (μm) or more, making similar semiconductor devices, non-uniform in thickness, difficult to manufacture and prone to defects.

BRIEF DESCRIPTION OF THE DRAWINGS

FIGS. 2a-2i illustrate a hybrid substrate with conductive vias, interconnect structures, and conductive pillars formed over opposite sides of the hybrid substrate;

FIGS. 5a-5c illustrate further detail of the interconnect structure of the hybrid substrate;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
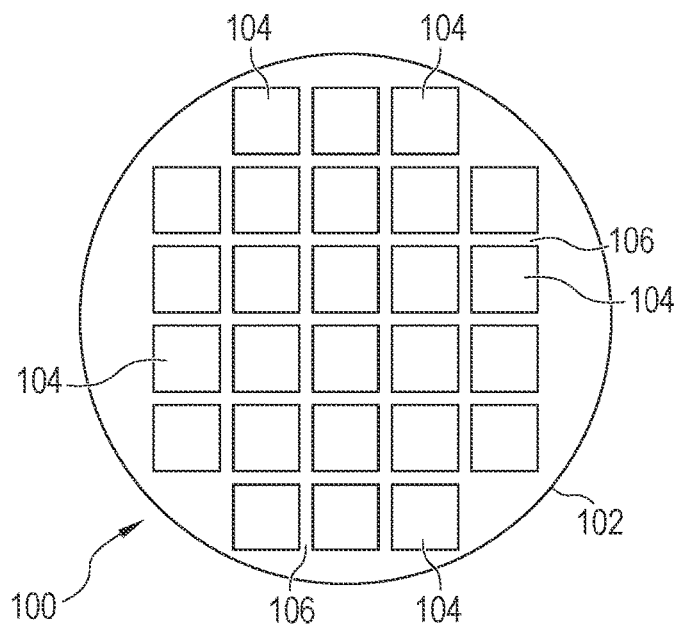
FIGS. 1a-1c illustrate a first semiconductor wafer with a plurality of first semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
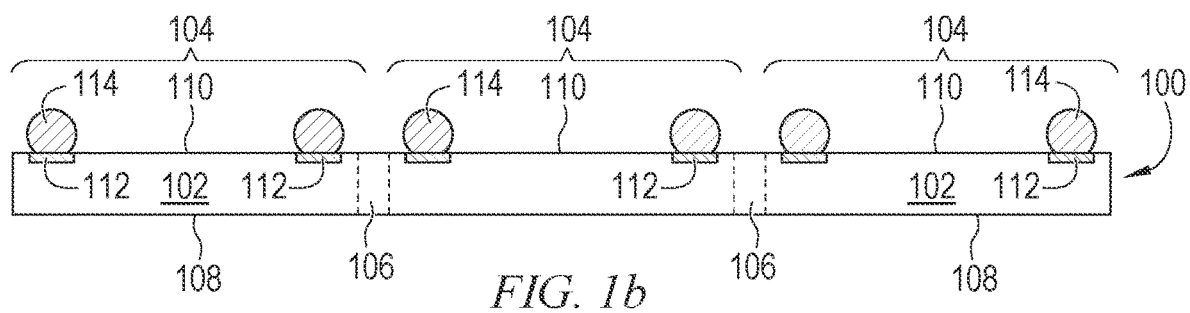

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
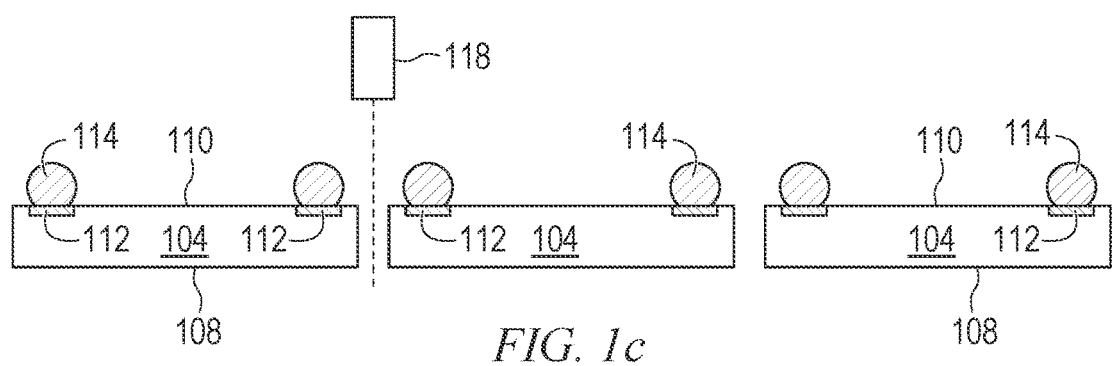

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

FIG. 2a shows a semiconductor wafer or panel substrate 120 with a base substrate material 122, such as silicon, germanium, aluminum phosphide, aluminum arsenide, gallium arsenide, gallium nitride, indium phosphide, silicon carbide, polymer (like Epoxy, polyimide) matrix composite materials with fillers and/or fibers, or other bulk material without insulation/dielectric property (for example resistivity>$1 \times 10^{10}$ ohm·cm) for structural/insulation support. Semiconductor substrate 120 has major surfaces 124 and 126. In one embodiment, semiconductor substrate 120 is a support structure to form electrical interconnect features over surfaces 124 and 126.

Alternatively, wafer 120 can have semiconductor devices formed on surface 124 and/or surface 126. An active surface 124 and/or 126 would contain analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within surface 124, 126 to implement analog circuits or digital circuits, such as DSP, ASIC, memory, or other signal processing circuit. Active surface 124, 126 may also contain IPDs, such as inductors, capacitors, and resistors, for RF signal processing.

In FIG. 2b, conductive through vias/holes 130 are formed completely through substrate 120. An optional solder resist/photoresist can be formed over surface 124. The solder resist/photoresist defines a pattern to etch vias completely through base semiconductor material 122 at the locations of conductive vias 130. The vias are filled or via sidewalls only are plated with conductive material and the solder resist/photoresist is removed leaving conductive vias 130. Conductive vias 130 can be Al, Cu, Sn, Ni, Au, Ag, or other suitable electrically conductive material. Alternatively, vias/holes 130 could be formed by mechanical drilling or laser drilling with solder resist/photoresist.

In FIG. 2c, a variety of core/plugging materials can be formed in conductive vias 130. A solder resist/photoresist can be formed over surface 124. The solder resist/photoresist defines a pattern to etch vias through previously formed conductive vias 130. For example, a via is formed through each of conductive vias 130a, 130b, and 130c. Alternatively, holes of 130 was previously only plated with metal at sidewalls without additional patterning and etching. The via formed through conductive via 130a is filled with plated magnetic materials or paste 132 to provide for tuning inductance. Magnetic material 132 can be iron, ferrite (nickel ferrite, nickel zinc ferrite, YIG ferrite), or other suitable magnetic powder or combinations thereof. Magnetic material 132 can be a plated magnetic film, such as NiFe, CoNiFe, or CoZrTa. In one embodiment, magnetic material 132 is a low-temperature (<200° C.) pressure-less curable powder paste, such as H701 and K250 from Ajinomoto. The vias formed through conductive vias 130b and 130c are filled with plated Cu or Cu paste 134 to improve thermal performance.

In FIG. 2d, conductive layer 140 is formed over surface 124 of substrate 120 using PVD, CVD, electrolytic plating, electroless plating process, or other suitable metal deposition process. Conductive layer 140 can be one or more layers of Al, Cu, Sn, Ni, Au, Ag, or other suitable electrically conductive material. Conductive layer 140 is a redistribution layer (RDL) and provides horizontal electrical interconnect across substrate 120 and vertical electrical interconnect to conductive vias 130. Portions of conductive layer 140 can be electrically common or electrically isolated depending on the design and function of semiconductor die and other electrical components attached thereto.

An insulating or passivation layer 142 is formed over surface 126 and conductive layer 140 using PVD, CVD, printing, lamination, spin coating, spray coating, sintering or thermal oxidation. Insulating layer 142 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Alternatively, insulating layer 142 can be a dielectric material, such as Ajinomoto build-up film (ABF) or polytetrafluoroethylene pre-impregnated (prepreg). Insulating layer 142 provides isolation around conductive layer 140. Insulating layer 142 provides isolation around conductive layer 140. Portions of insulating layer 142 are removed using an etching process or laser direct ablation (LDA) to expose conductive layer 140 for further electrical interconnect.

A conductive layer 144 is formed over surface 126 of substrate 120 using PVD, CVD, electrolytic plating, electroless plating process, or other suitable metal deposition process. Conductive layer 144 can be one or more layers of Al, Cu, Sn, Ni, Au, Ag, or other suitable electrically conductive material. Conductive layer 144 is an RDL and provides horizontal electrical interconnect across substrate 120 and vertical electrical interconnect to conductive vias 130. Portions of conductive layer 144 can be electrically common or electrically isolated depending on the design and function of semiconductor die and other electrical components attached thereto.

An insulating or passivation layer 146 is formed over surface 126 and conductive layer 144 using PVD, CVD, printing, lamination, spin coating, spray coating, sintering or thermal oxidation. Insulating layer 146 contains one or more layers of SiO2, Si3N4, SiON, Ta2O5, Al2O3, solder resist, polyimide, BCB, PBO, and other material having similar insulating and structural properties. Alternatively, insulating layer 146 can be a dielectric material, such as ABF or prepreg. Insulating layer 146 provides isolation around conductive layer 144. Portions of insulating layer 146 are removed using an etching process or LDA to expose conductive layer 144 for further electrical interconnect.

In FIG. 2e, conductive layer 150 is formed over conductive layer 140 and insulating layer 142 using PVD, CVD, electrolytic plating, electroless plating process, or other suitable metal deposition process. Conductive layer 150 can be one or more layers of Al, Cu, Sn, Ni, Au, Ag, or other suitable electrically conductive material. Conductive layer 150 is an RDL and provides horizontal electrical interconnect across substrate 120 and vertical electrical interconnect to conductive layer 140. Portions of conductive layer 150 can be electrically common or electrically isolated depending on the design and function of semiconductor die and other electrical components attached thereto.

An insulating or passivation layer 152 is formed over conductive layer 150 and insulating layer 142 using PVD, CVD, printing, lamination, spin coating, spray coating, sintering or thermal oxidation. Insulating layer 152 contains one or more layers of SiO2, Si3N4, SiON, Ta2O5, Al2O3, solder resist, polyimide, BCB, PBO, and other material having similar insulating and structural properties. Insulating layer 152 provides isolation around conductive layer 150. Portions of insulating layer 152 are removed using an etching process or LDA to expose conductive layer 150 for further electrical interconnect.

Figure 2F:
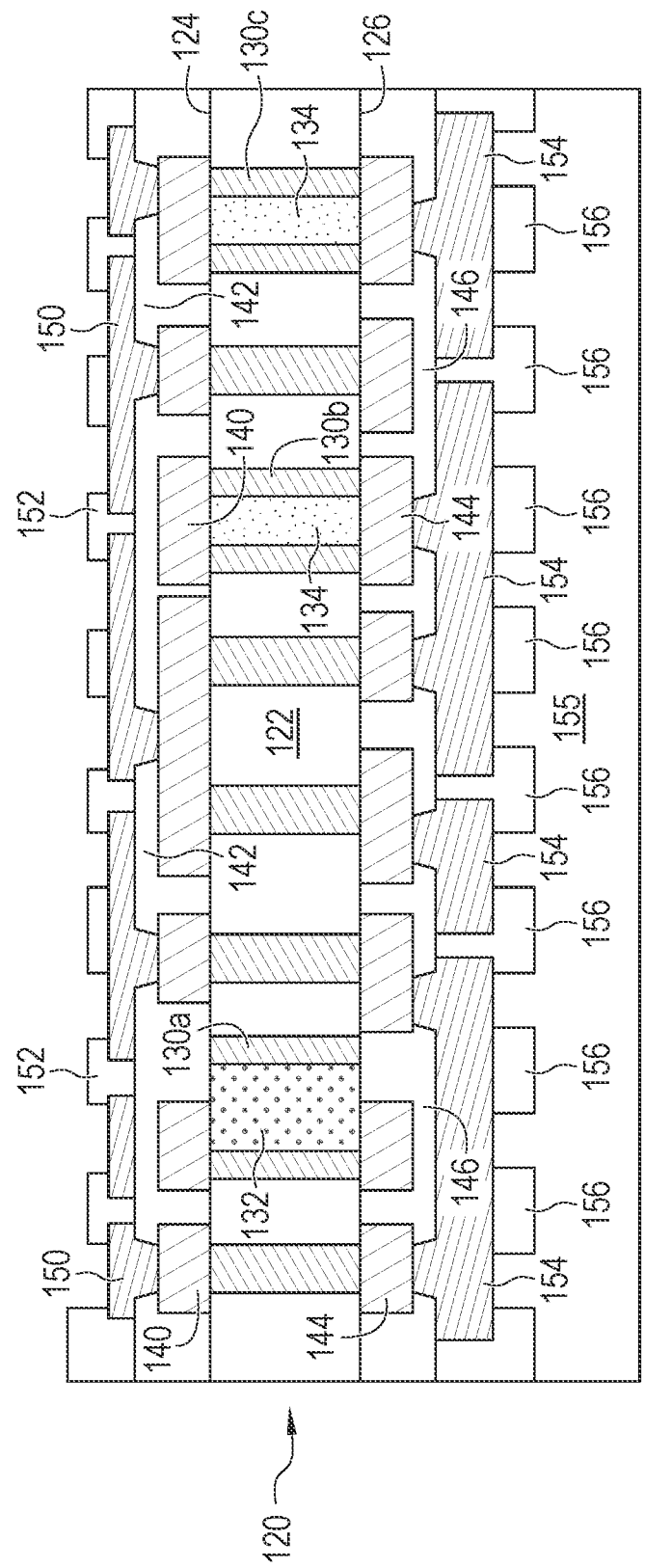

In FIG. 2f, conductive layer 154 is formed over conductive layer 144 and insulating layer 146 using PVD, CVD, electrolytic plating, electroless plating process, or other suitable metal deposition process. Conductive layer 154 can be one or more layers of Al, Cu, Sn, Ni, Au, Ag, or other suitable electrically conductive material. Conductive layer 154 is an RDL and provides horizontal electrical interconnect across substrate 120 and vertical electrical interconnect to conductive layer 144. Portions of conductive layer 154 can be electrically common or electrically isolated depending on the design and function of semiconductor die and other electrical components attached thereto.

An insulating or passivation layer 156 is formed over conductive layer 154 and insulating layer 146 using PVD, CVD, printing, lamination, spin coating, spray coating, sintering or thermal oxidation. Insulating layer 156 contains one or more layers of SiO2, Si3N4, SiON, Ta2O5, Al2O3, solder resist, polyimide, BCB, PBO, and other material having similar insulating and structural properties. Alternatively, insulating layer 156 can be a dielectric material, such as ABF or prepreg. Insulating layer 156 provides isolation around conductive layer 154. Portions of insulating layer 156 are removed using an etching process or LDA to expose conductive layer 154 for further electrical interconnect. Solder resist/photoresist 155 is formed over insulating layer 156.

Figure 2G:
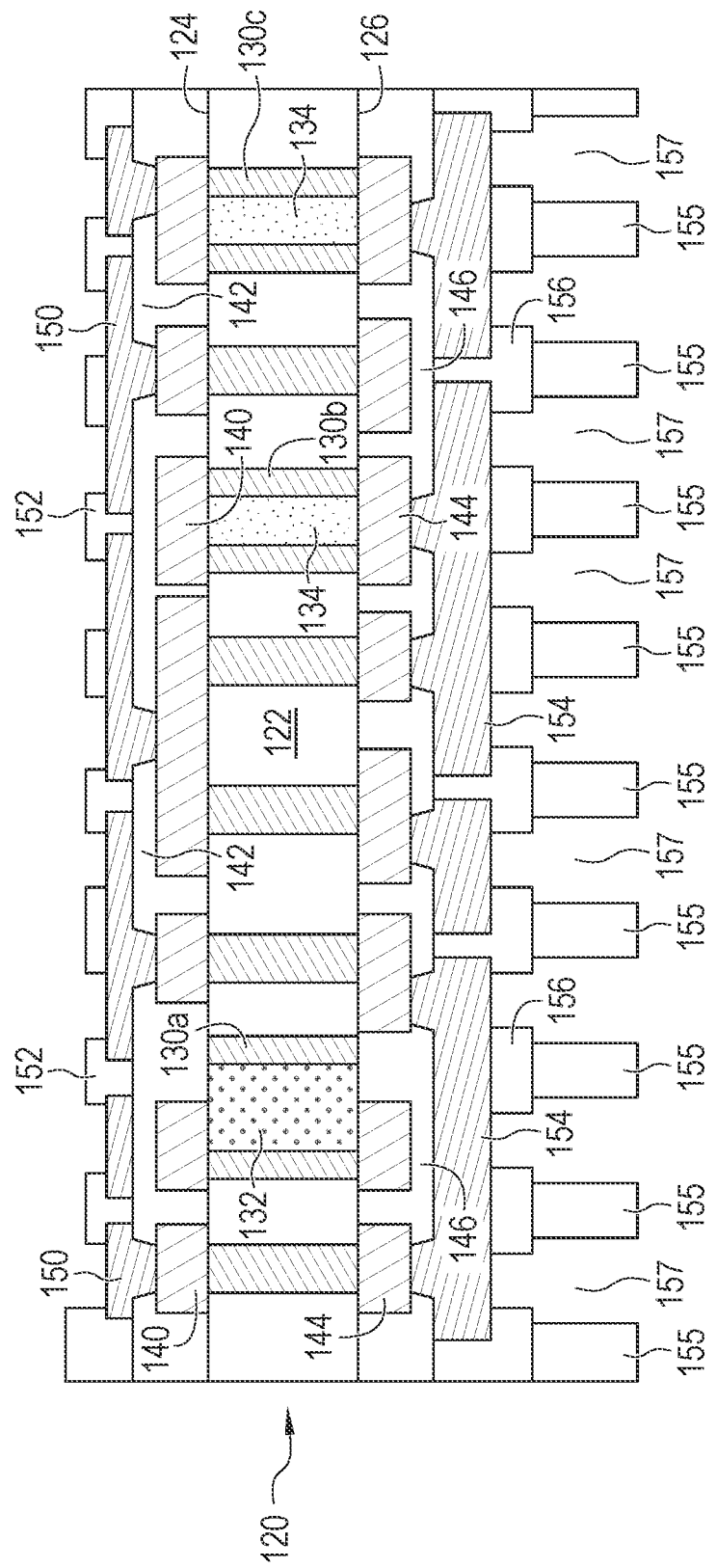
Figure 2H:
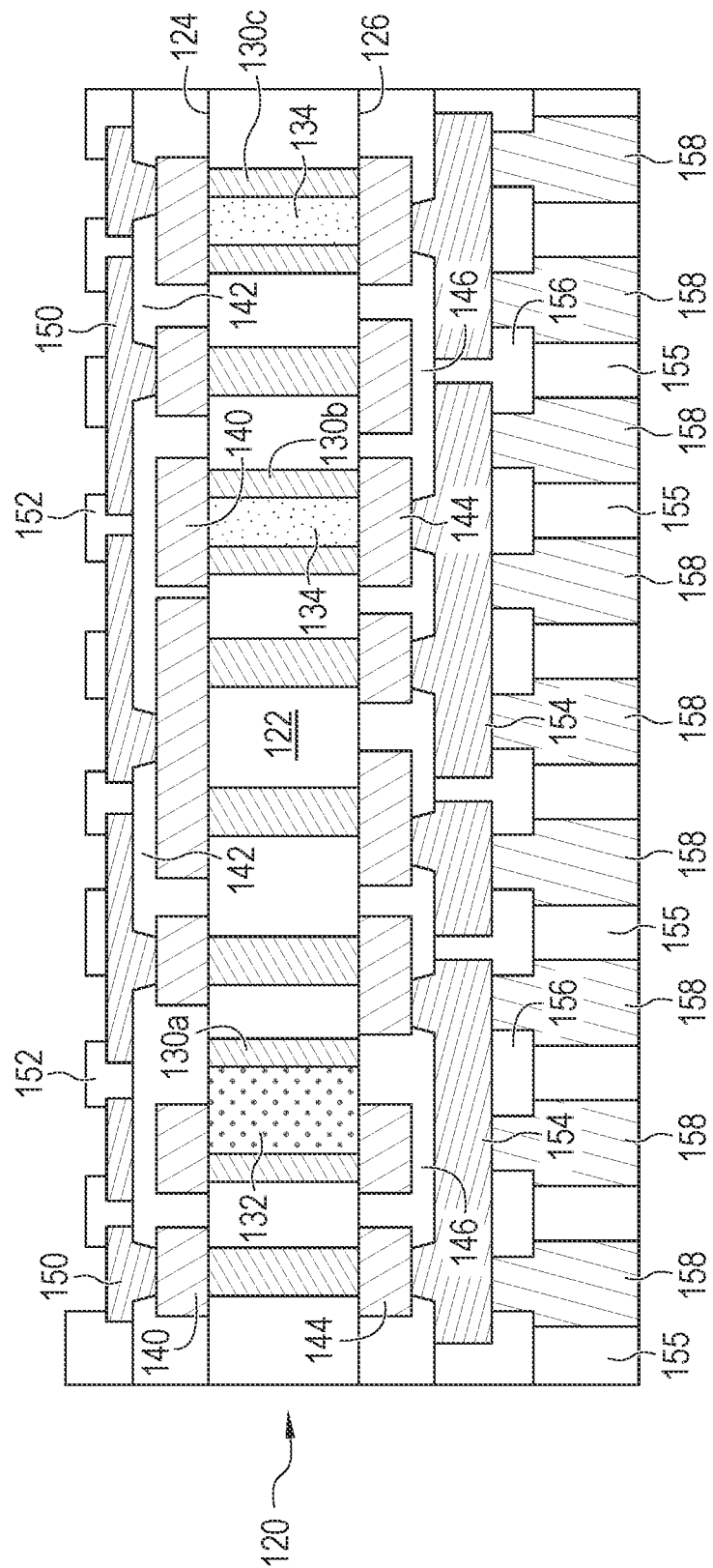
Figure 2I:
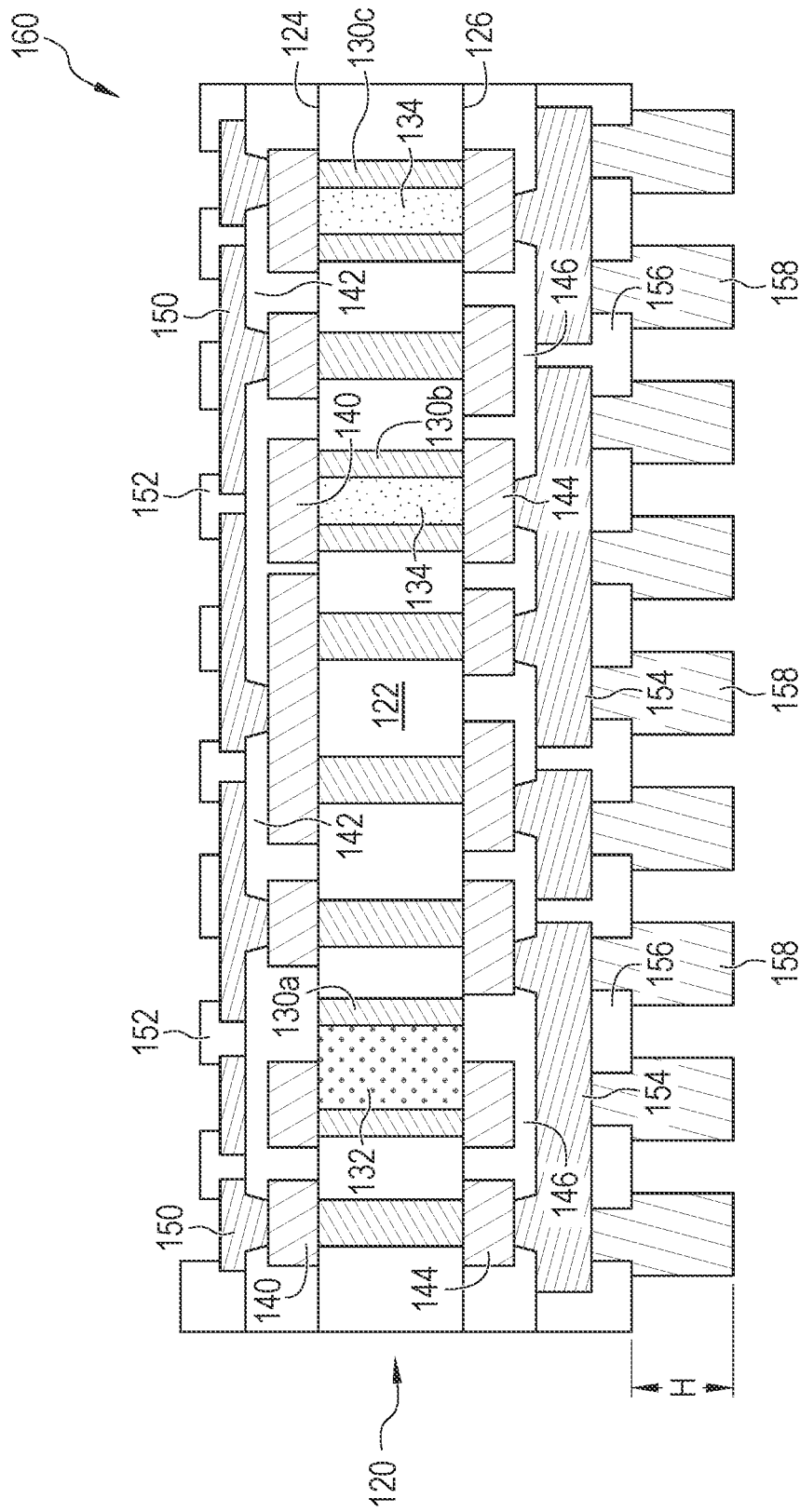

In FIG. 2g, a plurality of openings 157 is formed in solder resist/photoresist 155 using an etching process or LDA to define a pattern to form conductive columns or pillars. Openings 157 are filled with conductive material, as shown in FIG. 2h. In FIG. 2i, the remaining solder resist/photoresist 155 is removed leaving conductive columns or pillars or post 158. Conductive columns or pillars or post 158 can be Al, Cu, Sn, Ni, Au, Ag, multi-layer combined or other suitable electrically conductive material. Conductive pillars 158 can have a height H of 25 μm or more.

Substrate 120 is embedded within conductive layers 140, 144, 150, and 154, and insulating layers 142, 146, 152, and 156, which constitutes an interconnect structure with an embedded substrate. The combination of embedded substrate 120 with conductive layers 140, 144, 150, and 154, insulating layers 142, 146, 152, and 156, and conductive pillars 158 constitute hybrid substrate 160. Notable, hybrid substrate 160 with conductive pillars 158 formed on at least one side of the substrate is provided prior to encapsulation, as shown in FIG. 2i.

Figure 3A:
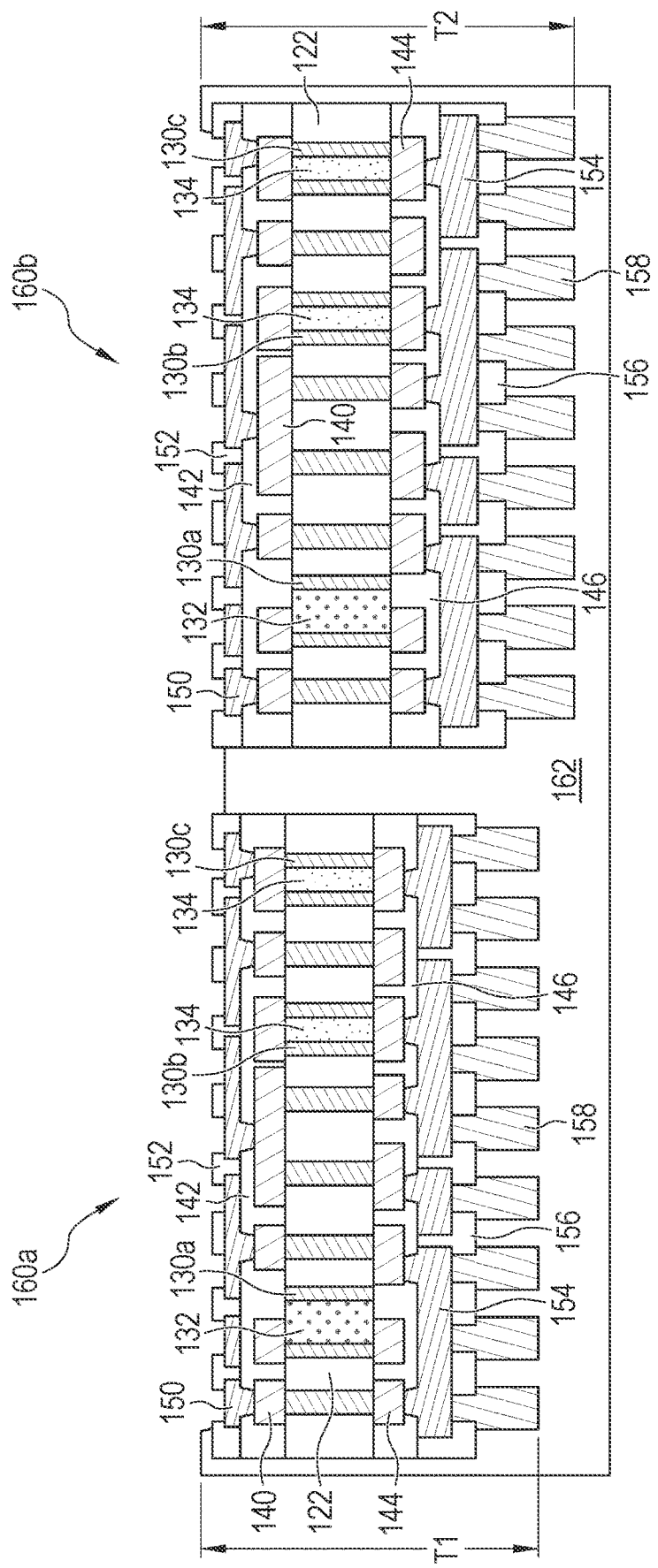
FIGS. 3a-3e illustrate post formation encapsulation of the hybrid substrate.

In FIG. 3a, a plurality of hybrid substrates 160 is positioned together for encapsulation. Although FIG. 3a shows two hybrid substrates 160a and 160b, any number of hybrid substrates can be laid out on a carrier or panel for encapsulation as a reconstituted wafer. Note that conductive pillars 158 are formed on the ball grid array (BGA) side of hybrid substrates 160a and 160b. Hybrid substrate 160a may have a thickness T1 different from hybrid substrate 160b with thickness T2, i.e., T1<T2. The difference in thickness between hybrid substrate 160a and 160b can be attributed to variation in interconnect structures and conductive pillars during manufacturing. The variation or difference between T1 and T2 can be 20 μm or more.

An encapsulant or molding compound 162 is deposited over and around hybrid substrates 160 using a paste printing, compressive molding, transfer molding, liquid encapsulant molding, vacuum lamination, spin coating, or other suitable applicator. Encapsulant 162 can be polymer composite material, such as epoxy resin with filler, epoxy acrylate with filler, or polymer with proper filler. Encapsulant 162 is non-conductive, provides structural support, and environmentally protects the semiconductor device from external elements and contaminants. In particular, encapsulant 162 is deposited post formation of hybrid substrates 160.

Figure 3B:
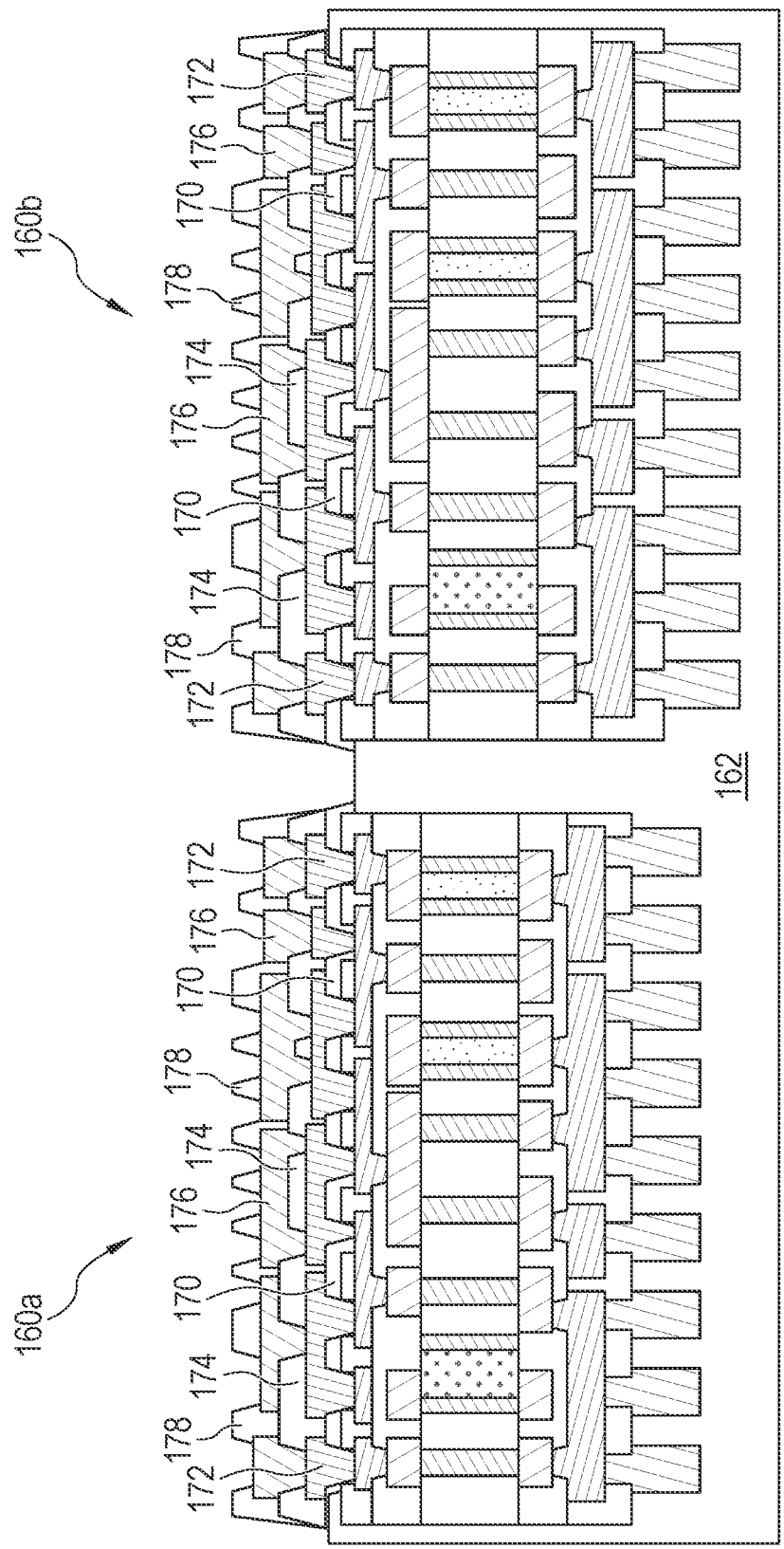

At least one RDL and insulating layer and one metal layer with finer line/space than substrate is built up on the reconstituted hybrid substrate 160. For example, in FIG. 3b, insulating or passivation layer 170 is formed over conductive layer 150 and insulating layer 152 using PVD, CVD, printing, lamination, spin coating, spray coating, sintering or thermal oxidation. Insulating layer 170 contains one or more layers of SiO2, Si3N4, SiON, Ta2O5, Al2O3, solder resist, polyimide, BCB, PBO, and other material having similar insulating and structural properties. Insulating layer 170 provides isolation around conductive layer 150. Portions of insulating layer 170 are removed using an etching process or LDA to expose conductive layer 152 for further electrical interconnect.

A conductive layer 172 is formed over conductive layer 150 and insulating layer 170 using PVD, CVD, electrolytic plating, electroless plating process, or other suitable metal deposition process. Conductive layer 172 can be one or more layers of Al, Cu, Sn, Ni, Au, Ag, or other suitable electrically conductive material. Conductive layer 172 is an RDL and provides horizontal electrical interconnect across substrate 120 and vertical electrical interconnect to conductive layer 150. Portions of conductive layer 172 can be electrically common or electrically isolated depending on the design and function of semiconductor die and other electrical components attached thereto.

An insulating or passivation layer 174 is formed over conductive layer 172 and insulating layer 170 using PVD, CVD, printing, lamination, spin coating, spray coating, sintering or thermal oxidation. Insulating layer 174 contains one or more layers of SiO2, Si3N4, SiON, Ta2O5, Al2O3, solder resist, polyimide, BCB, PBO, and other material having similar insulating and structural properties. Insulating layer 174 provides isolation around conductive layer 172. Portions of insulating layer 174 are removed using an etching process or LDA to expose conductive layer 172 for further electrical interconnect.

A conductive layer 176 is formed over conductive layer 172 and insulating layer 174 using PVD, CVD, electrolytic plating, electroless plating process, or other suitable metal deposition process. Conductive layer 176 can be one or more layers of Al, Cu, Sn, Ni, Au, Ag, or other suitable electrically conductive material. Conductive layer 176 is an RDL and provides horizontal electrical interconnect across substrate 120 and vertical electrical interconnect to conductive layer 172. Portions of conductive layer 176 can be electrically common or electrically isolated depending on the design and function of semiconductor die and other electrical components attached thereto.

An insulating or passivation layer 178 is formed over conductive layer 176 and insulating layer 174 using PVD, CVD, printing, lamination, spin coating, spray coating, sintering or thermal oxidation. Insulating layer 178 contains one or more layers of SiO2, Si3N4, SiON, Ta2O5, Al2O3, solder resist, polyimide, BCB, PBO, and other material having similar insulating and structural properties. Insulating layer 178 provides isolation around conductive layer 176. Portions of insulating layer 178 are removed using an etching process or LDA to expose conductive layer 176 for further electrical interconnect. Conductive layers 172 and 176 and insulating layers 170, 174, and 178 constitute additional interconnect structures formed over hybrid substrate 160. In one embodiment, conductive layer 176 may be the last metal layer and have additional surface finish of Cu OSP or Ni/Au, or ENEPIG finishing on all exposed pads or metal surface.

Figure 3C:
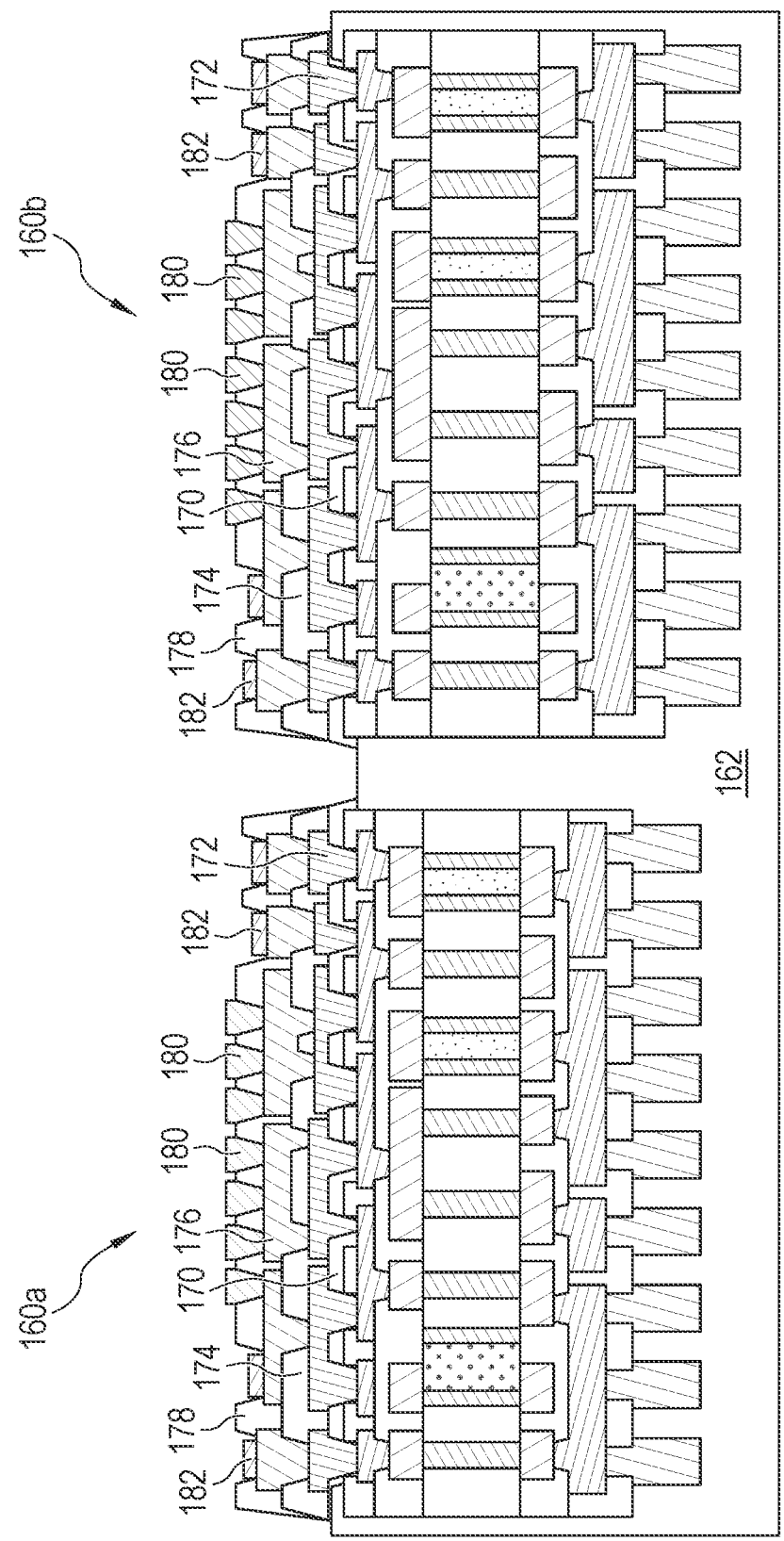

In FIG. 3c, solder ball/paste or conductive paste 180 is deposited over conductive layer 176, i.e., solder on pad (SOP) with optional UBM, following by coining process. A Cu organic solderability preservative (OSP), or electroless-nickel electroless-palladium immersion gold (ENEPIG), or electroless nickel immersion gold (ENIG) finish or layer 182 is formed on conductive layer 176.

Figure 3D:
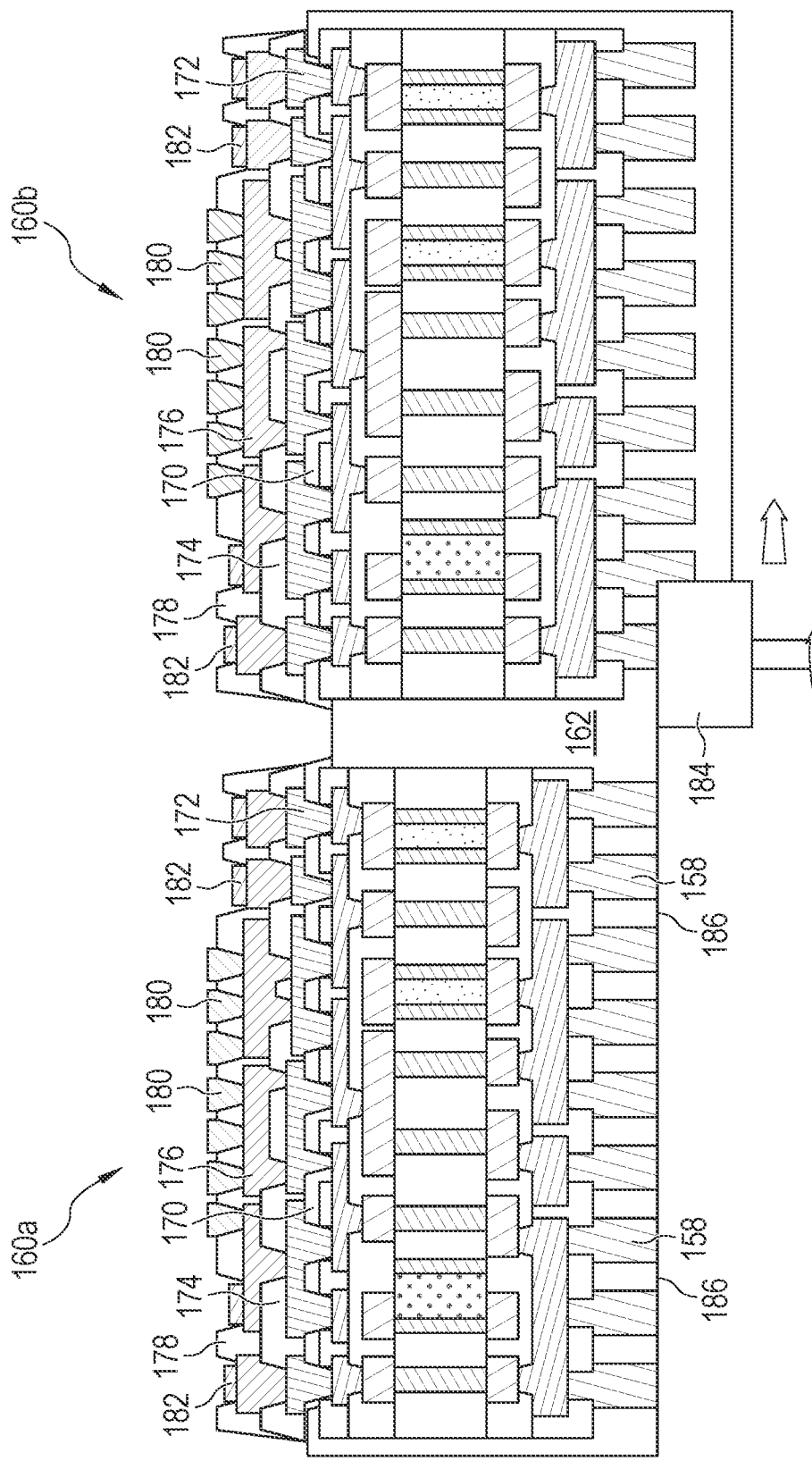

In FIG. 3d, a portion of encapsulant 162 is removed by grinder 184 to planarize surface 186 of the encapsulant and expose conductive pillars 158. Alternatively, a portion of encapsulant 162 is removed by plasma/chemical etch. Note that the exposed surface of conductive pillars 158 is not necessarily coplanar with surface 186. The amount of encapsulant 162 removed depends in part on the relative sizes of hybrid substrates 160, in order to expose conductive pillars 158 of all embedded hybrid substrates. In particular, the grinding operation compensates for variation in thickness T1 of hybrid substrate 160a and thickness T2 of hybrid substrate 160b, see FIG. 3a. Hybrid substrate 160a being of lesser thickness has less material removed and hybrid substrate 160b being of greater thickness has more material removed. Thus, the thickness T3 of hybrid substrates 160a-160b are made uniform post grinding. Encapsulant 162 is planarized and conductive pillars 158 exposed, independent of the variation in thickness of various hybrid substrates 160.

Figure 3E:
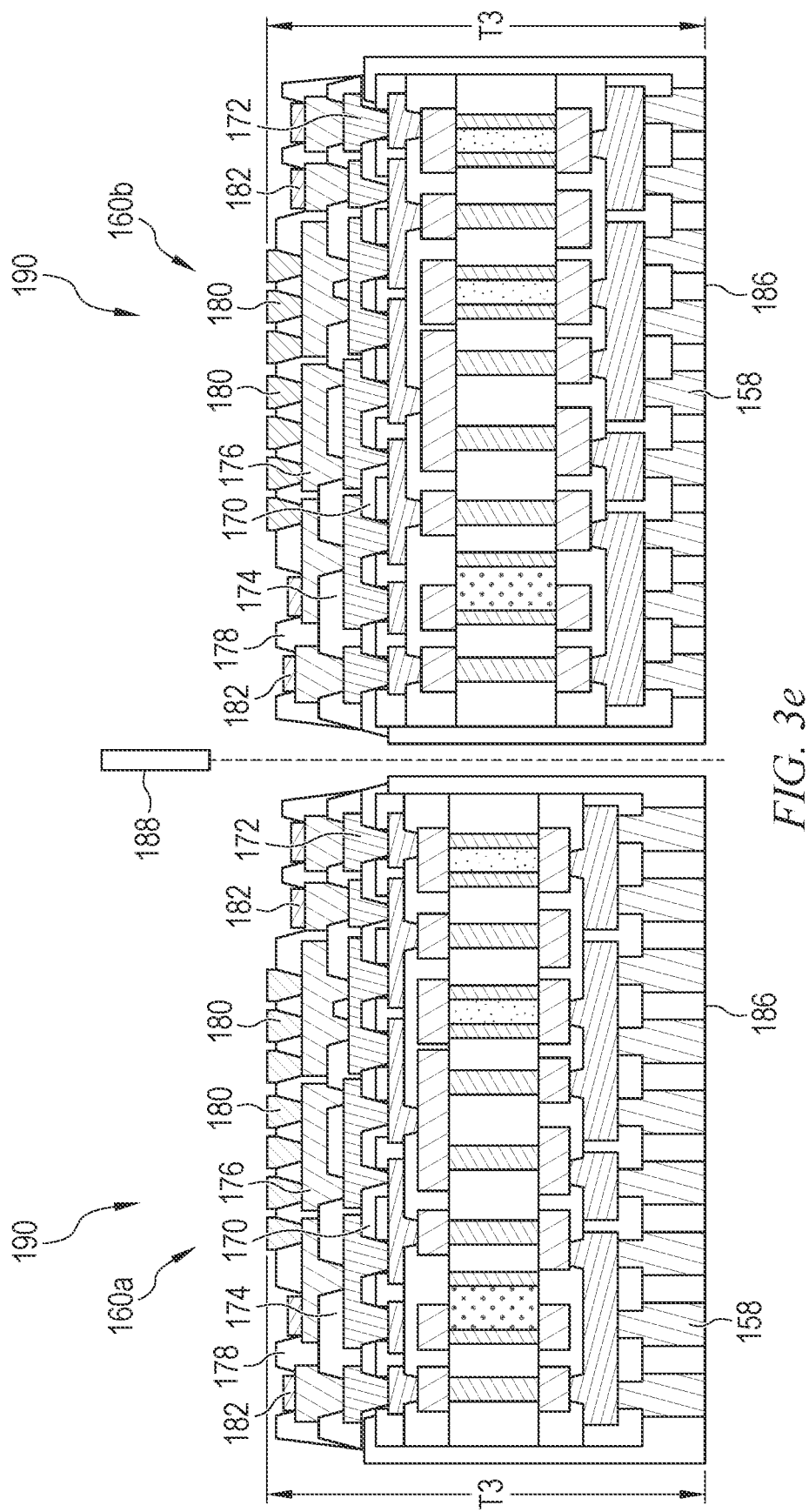

In FIG. 3e, the encapsulated hybrid substrate 160, with additional conductive layers 172 and 176 and insulating layers 170, 174, and 178, is singulated using a saw blade or laser cutting tool 188 into individual semiconductor assemblies 190. Hybrid substrate 160 have conductive pillars formed on at least one side of the embedded substrate, prior to encapsulation to compensate for variation in substrate thickness. A grinding process is used to achieve uniform thickness T3 for hybrid substrates 160a and 160b, i.e., hybrid substrates 160a and 160b have the same thickness T3 post grinding.

Figure 4A:
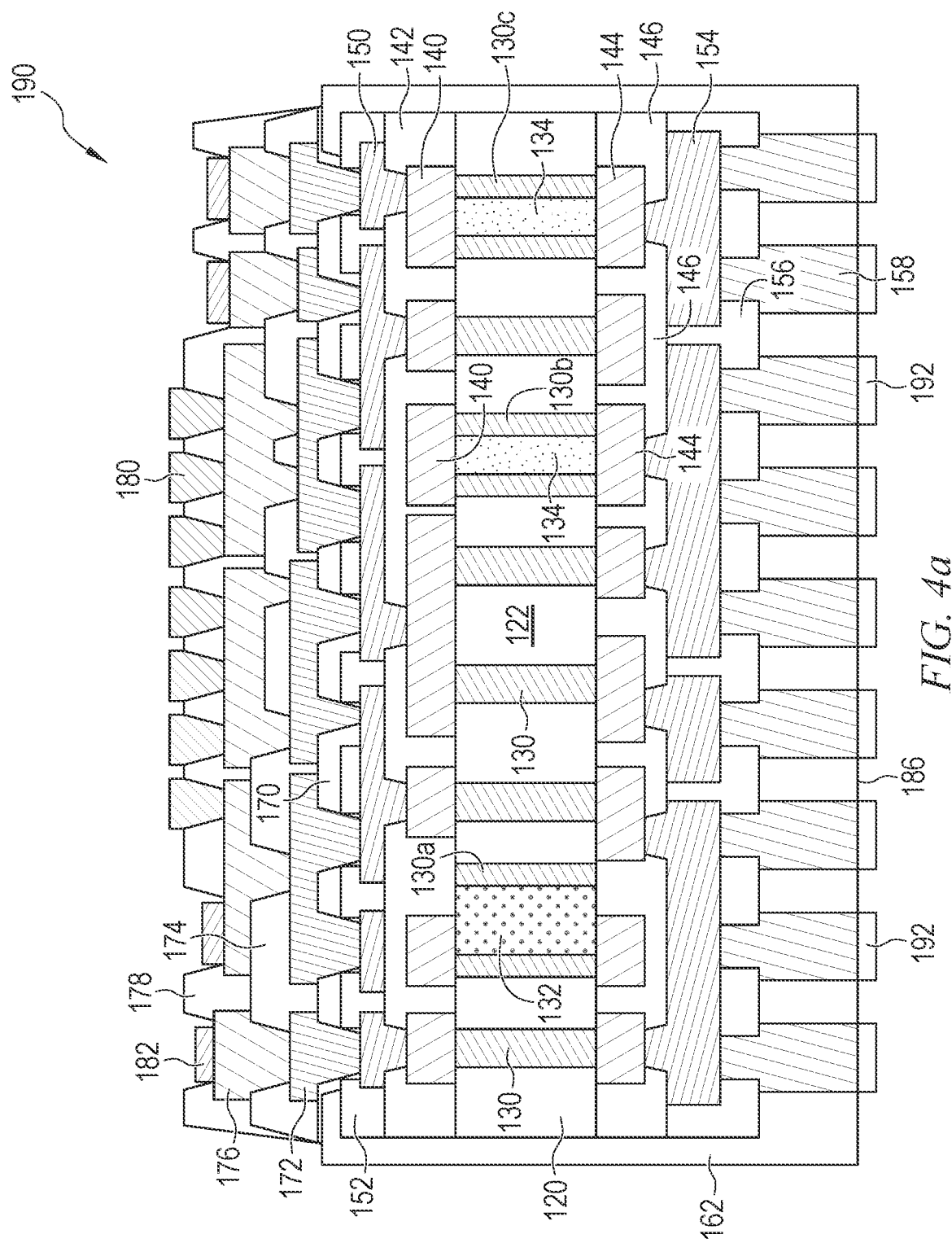
FIGS. 4a-4d illustrate disposing electrical components over the hybrid substrate.

FIG. 4a shows semiconductor assembly 190 post singulation. ENEPIG or ENIG finish or Cu OSP 192 is formed on conductive pillar 158. ENEPIG or ENIG finish or Cu OSP 192 is formed at the same time as ENEPIG or ENIG finish or Cu OSP 182.

Figure 4B:
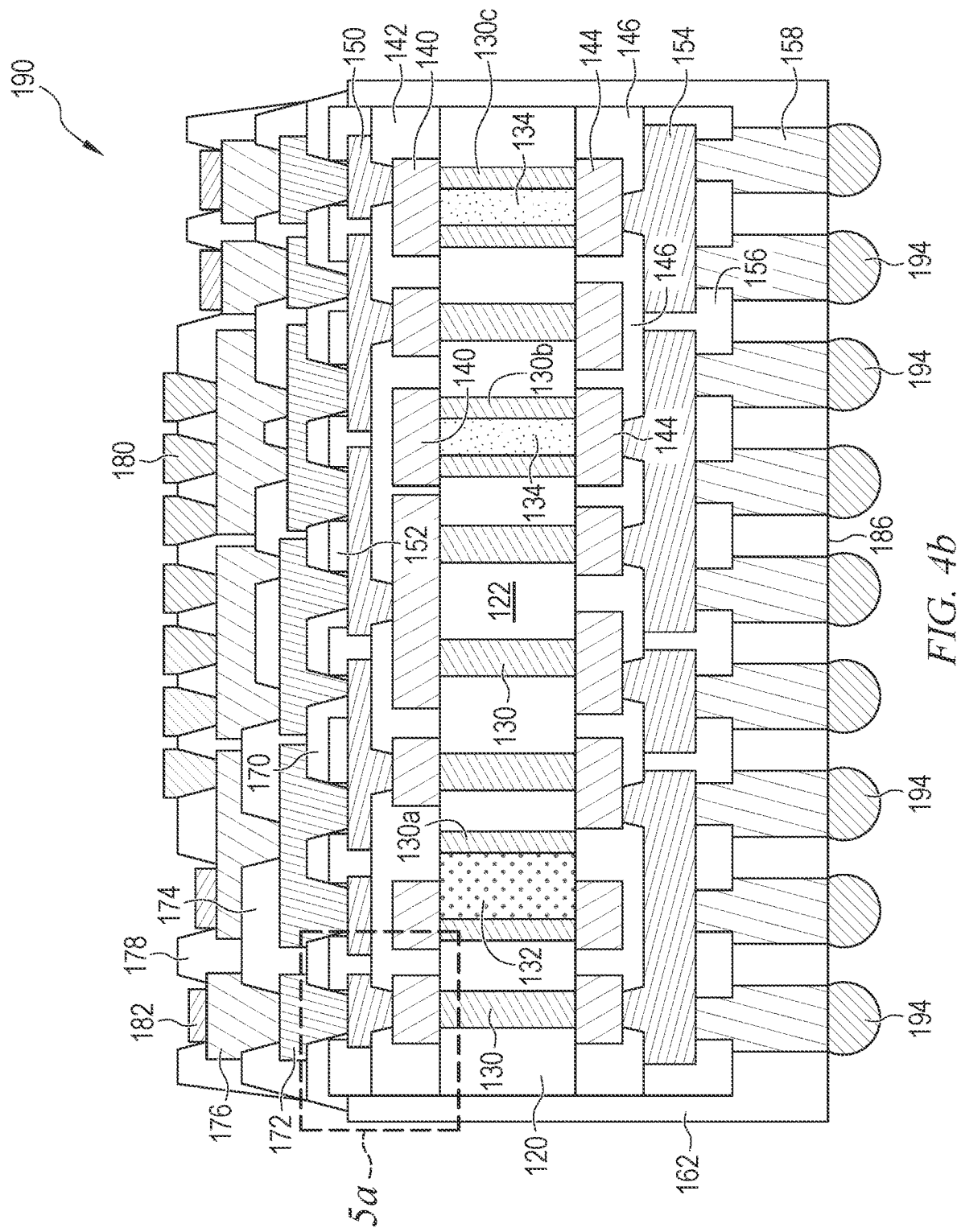

In FIG. 4b, an electrically conductive bump material is deposited over ENEPIG or ENIG finish or Cu OSP 192 on conductive pillars 158 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillars 158 using a suitable attachment or bonding process. In one embodiment, the bump material is reflowed by heating the material above its melting point to form balls or bumps 194. In one embodiment, bump 194 is formed over a UBM having a wetting layer, barrier layer, and adhesive layer. Bump 194 can also be compression bonded or thermocompression bonded to conductive pillars 158. In one embodiment, bump 194 is a copper core bump for durability and maintaining its height. Bump 194 represents one type of interconnect structure that can be formed over conductive pillars 158. The interconnect structure can also use bond wires, conductive paste, stud bump, micro bump, or other electrical interconnect.

Non-uniform thickness hybrid substrates 160 pre-encapsulation are made to have uniform thickness hybrid substrates during a grinding operation post encapsulation. The post encapsulation grinding process compensates for variation in hybrid substrate thickness. Hybrid substrates 160 have uniform thickness T3 post grinding. Uniform thickness hybrid substrates 160 contained within semiconductor assembly 190 have good thermal performance and electromigration (EM) performance.

FIGS. 5a-5c show further detail of RDL area 5a from FIG. 4b. Elements having a similar function are assigned the same reference number in the figures. In FIG. 5a, the flat, horizontal surface 202 of encapsulant 162 is lower than surface 204 of insulating layer 152. Angled or slanted surface 208 of encapsulant 162 rises to align with surface 204. Via 210 is formed through insulating layer 170 to expose conductive layer 150. Encapsulant 162 covers a portion of surface 212 of insulating layer 142. Filler material 216 is wholly contained within insulating layer 152 and not exposed from any surface thereof. Filler material 218 is contained wholly within encapsulant 162 and not exposed from any surface thereof.

FIG. 5b is a top view of RDL area 5a. Insulating layer 152 exhibits straight edges 220 with chamfered corners 222. Alternatively, insulating layer 152 exhibits protruding or gear-shaped edges 224, as shown in the top view of FIG. 5c.

Figure 4C:
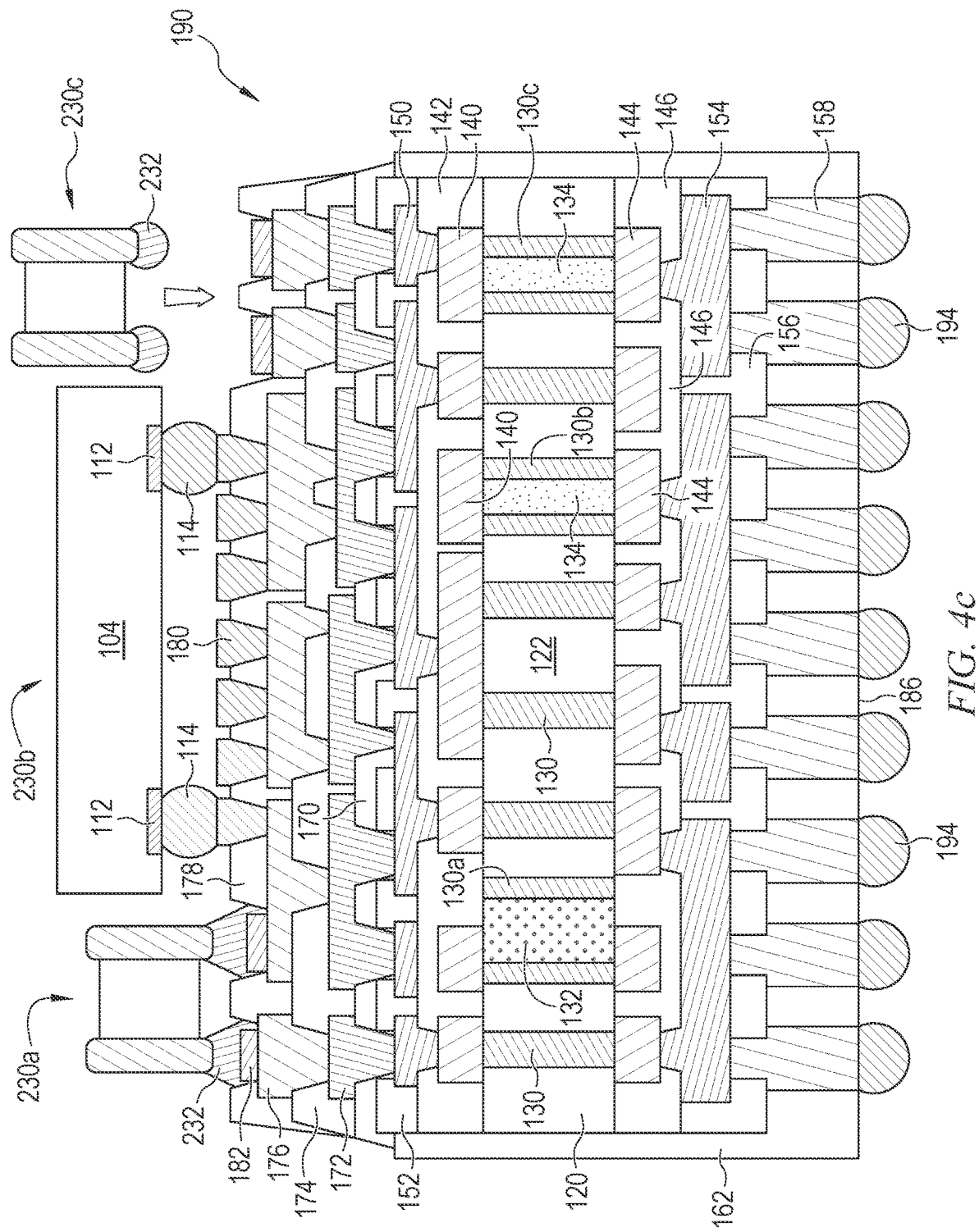

Continuing with FIG. 4c, a plurality of electrical components 230a-230c is disposed on semiconductor assembly 190 and electrically and mechanically connected to conductive layer 176. Electrical components 230a-230c are each positioned over semiconductor assembly 190 using a pick and place operation. For example, electrical component 230b can be similar to semiconductor die 104 from FIG. 1c or fan-out MCM die with bumps 114 oriented toward semiconductor assembly 190. In both FIGS. 4c and 4d, conductive paste 180 pads are all connected with solder bumps or Cu pillars of Si die or Fan-out die. Electrical component 230a and 230c can be discrete electrical devices, or IPDs, such as a diode, transistor, resistor, capacitor, and inductor. Alternatively, electrical component 230a-230c can include other semiconductor die, semiconductor packages, surface mount devices, discrete electrical devices, or IPDs.

Figure 4D:
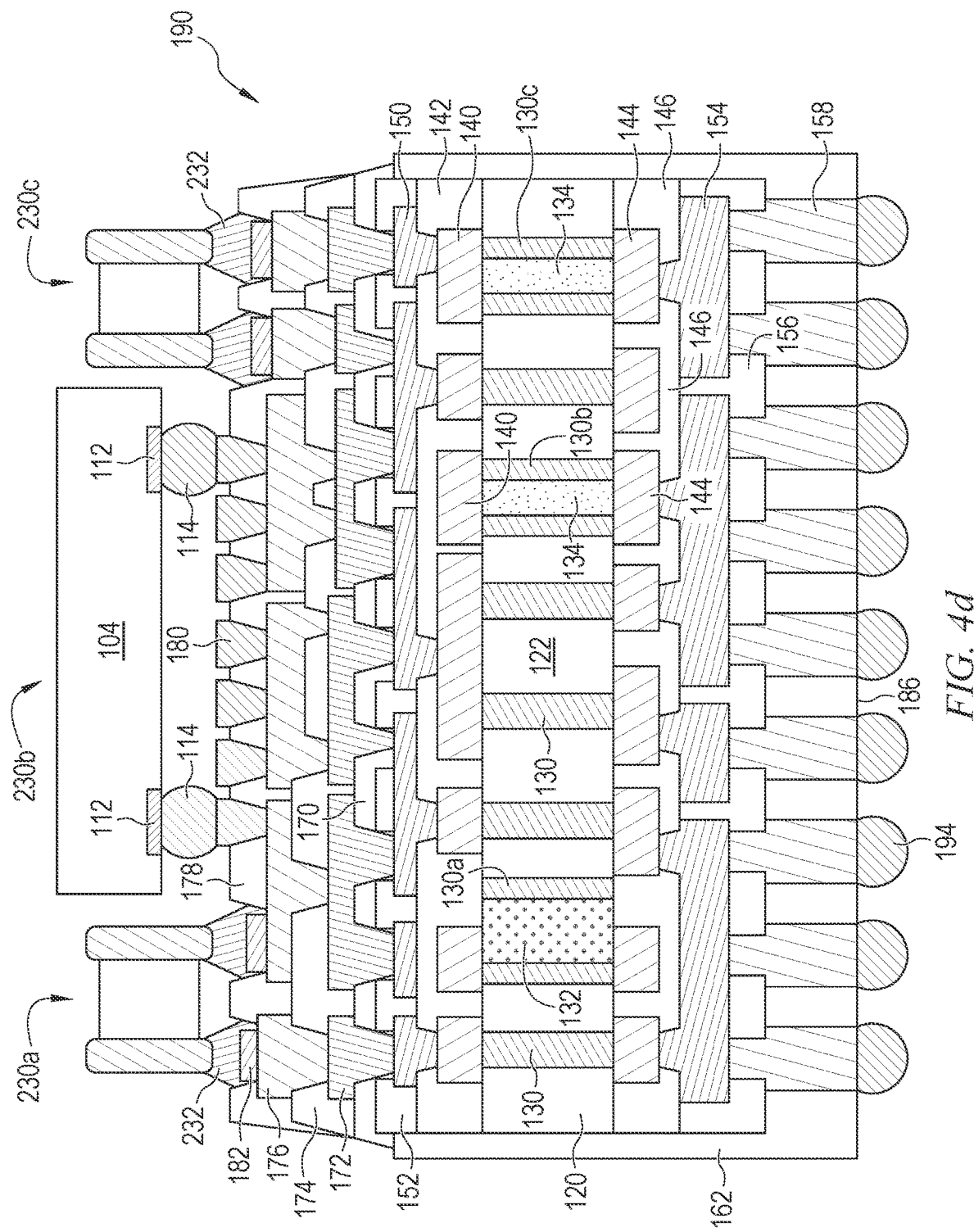

Electrical components 230a-230c are brought into contact with conductive layer 176 of semiconductor assembly 190. Electrical component 230b is electrically and mechanically connected to conductive layer 176 with bumps 114. Electrical components 230a and 230c are electrically and mechanically connected to conductive layer 176 using solder or conductive paste 232. FIG. 4d illustrates electrical components 230a-230c electrically and mechanically connected to conductive layer 176 of semiconductor assembly 190.

Figure 6A:
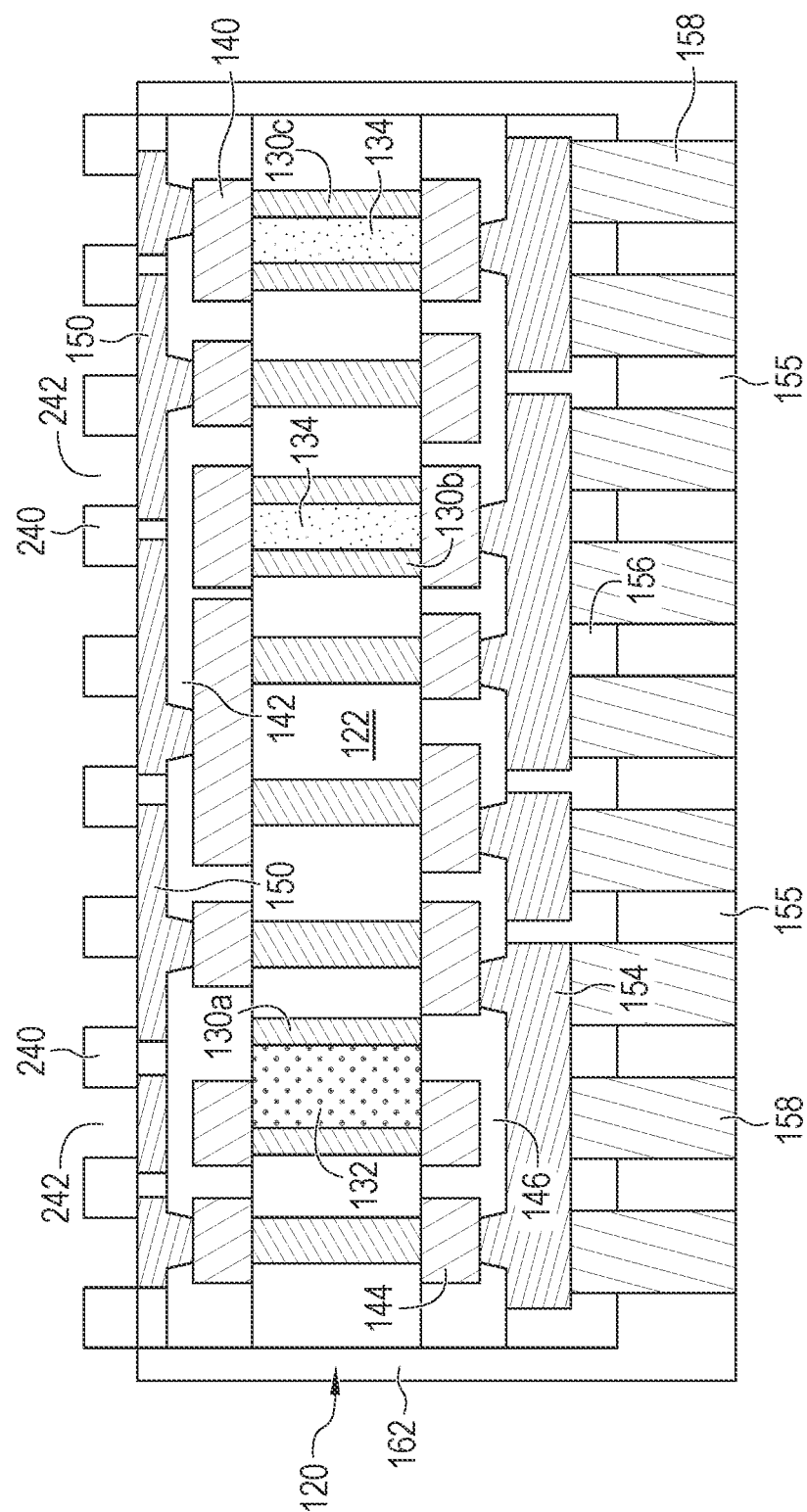
FIGS. 6a-6c illustrate a hybrid substrate with conductive pillars formed over opposite sides of the hybrid substrate.

In another embodiment, continuing from FIG. 2i minus insulating layer 152, insulating or passivation layer 240 is formed over conductive layer 150 and insulating layer 142 using PVD, CVD, printing, lamination, spin coating, spray coating, sintering or thermal oxidation, as shown in FIG. 6a. Insulating layer 240 contains one or more layers of SiO2, Si3N4, SiON, Ta2O5, Al2O3, solder resist, polyimide, BCB, PBO, and other material having similar insulating and structural properties. Alternatively, insulating layer 240 can be a dielectric material, such as AEF or prepreg. Insulating layer 240 provides isolation around conductive layer 150. Portions of insulating layer 240 are removed using an etching process or LDA to form vias or openings 242 and expose conductive layer 150 for further electrical interconnect.

Figure 6B:
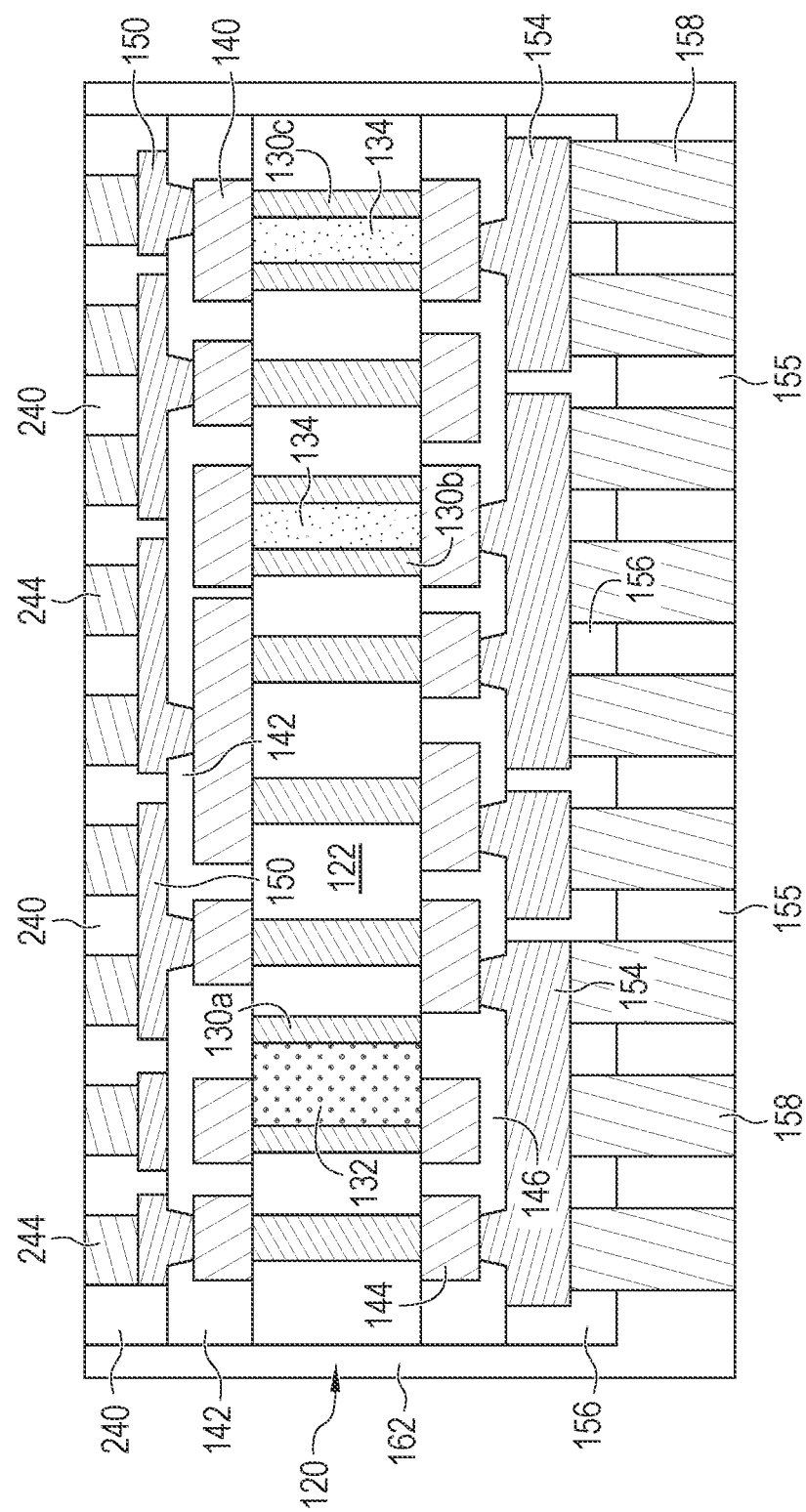

In FIG. 6b, openings 242 are filled with conductive material to form conductive columns or pillars 244. Conductive columns or pillars 244 can be Al, Cu, Sn, Ni, Au, Ag, or other suitable electrically conductive material. Conductive pillars 244 and insulating layer 240 may undergo grinding operation to planarize the insulating layer, similar to FIG. 3d. Alternatively, insulating layer 240 is plasma/chemical etched to planarize the insulating layer. Conductive pillars 244 can have a height of 25 μm or more. Accordingly, conductive pillars 244 can be formed on a second side of hybrid substrate 160, opposite conductive pillars 158.

Another RDL and insulating layer and one metal layer with finer line/space than substrate is built up on the reconstituted hybrid substrate 160. For example, in FIG. 6c, conductive layer 250 is formed over conductive pillars 244 and insulating layer 240 using PVD, CVD, electrolytic plating, electroless plating process, or other suitable metal deposition process. Conductive layer 250 can be one or more layers of Al, Cu, Sn, Ni, Au, Ag, or other suitable electrically conductive material. Conductive layer 250 is an RDL and provides horizontal electrical interconnect across substrate 120 and vertical electrical interconnect to conductive layer 150. Portions of conductive layer 250 can be electrically common or electrically isolated depending on the design and function of semiconductor die and other electrical components attached thereto.

An insulating or passivation layer 252 is formed over conductive layer 250 and insulating layer 240 using PVD, CVD, printing, lamination, spin coating, spray coating, sintering or thermal oxidation. Insulating layer 252 contains one or more layers of SiO2, Si3N4, SiON, Ta2O5, Al2O3, solder resist, polyimide, BCB, PBO, and other material having similar insulating and structural properties. Insulating layer 252 provides isolation around conductive layer 250. Portions of insulating layer 252 are removed using an etching process or LDA to expose conductive layer 250 for further electrical interconnect.

A conductive layer 254 is formed over conductive layer 250 and insulating layer 252 using PVD, CVD, electrolytic plating, electroless plating process, or other suitable metal deposition process. Conductive layer 254 can be one or more layers of Al, Cu, Sn, Ni, Au, Ag, or other suitable electrically conductive material. Conductive layer 254 is an RDL and provides horizontal electrical interconnect across substrate 120 and vertical electrical interconnect to conductive layer 250. Portions of conductive layer 254 can be electrically common or electrically isolated depending on the design and function of semiconductor die and other electrical components attached thereto.

An insulating or passivation layer 256 is formed over conductive layer 254 and insulating layer 252 using PVD, CVD, printing, lamination, spin coating, spray coating, sintering or thermal oxidation. Insulating layer 256 contains one or more layers of SiO2, Si3N4, SiON, Ta2O5, Al2O3, solder resist, polyimide, BCB, PBO, and other material having similar insulating and structural properties. Insulating layer 256 provides isolation around conductive layer 254. Portions of insulating layer 256 are removed using an etching process or LDA to expose conductive layer 254 for further electrical interconnect.

Solder or conductive paste 258 is deposited over conductive layer 254, i.e., SOP with optional UBM, following by coining process. A Cu OSP, or ENEPIG, or ENIG finish or layer 260 is formed on conductive layer 254.

An electrically conductive bump material is deposited on conductive pillars 158 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillars 158 using a suitable attachment or bonding process. In one embodiment, the bump material is reflowed by heating the material above its melting point to form balls or bumps 264. In one embodiment, bump 264 is formed over a UBM having a wetting layer, barrier layer, and adhesive layer. Bump 264 can also be compression bonded or thermocompression bonded to conductive pillars 158. In one embodiment, bump 264 is a copper core bump for durability and maintaining its height. Bump 264 represents one type of interconnect structure that can be formed over conductive pillars 158. The interconnect structure can also use bond wires, conductive paste, stud bump, micro bump, or other electrical interconnect.

The combination of hybrid substrate 160, with additional conductive pillars 158 and 244, conductive layers 250 and 254, and insulating layers 252 and 256 constitute semiconductor assembly 266.

Figure 6C:
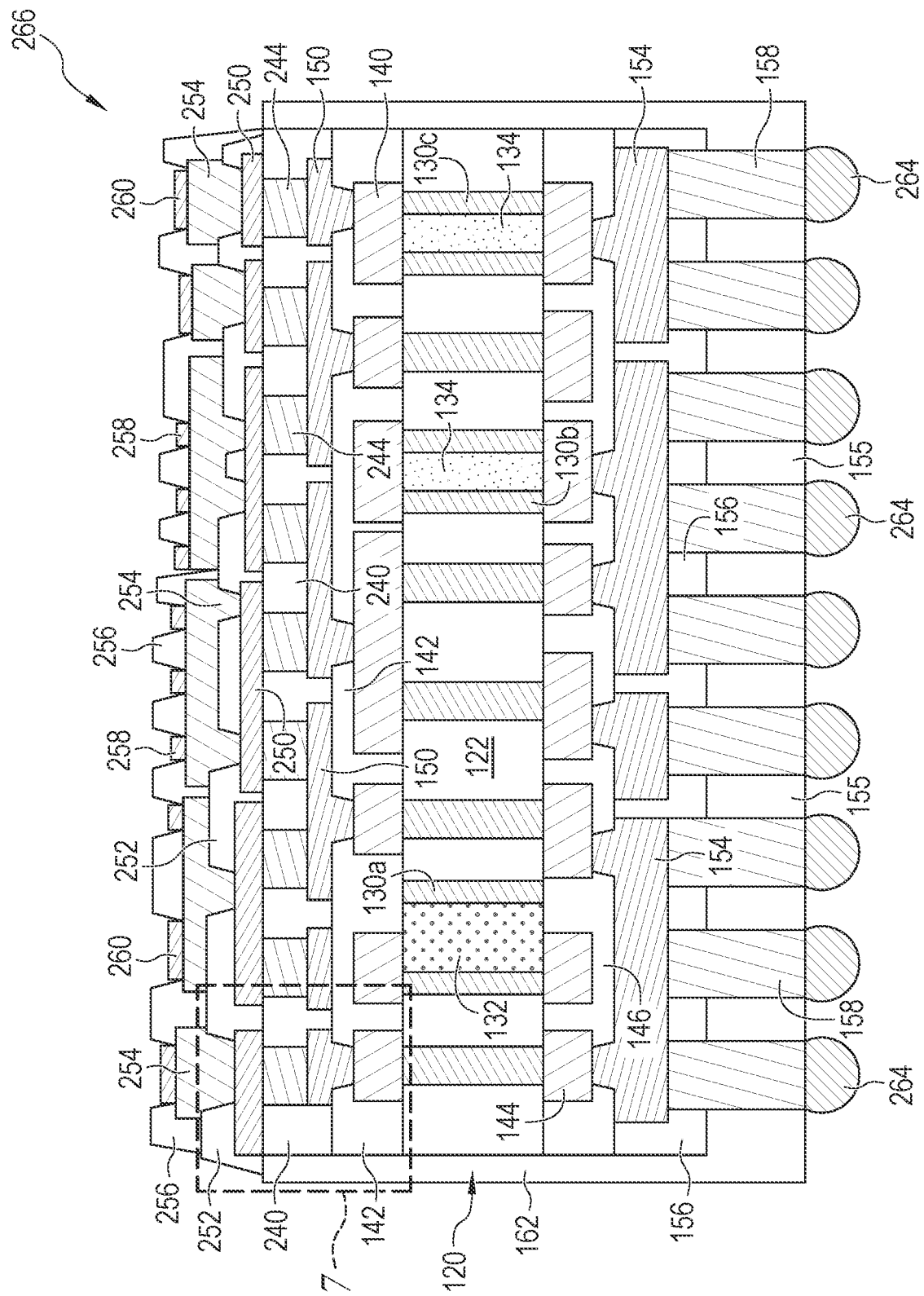
Figure 7:
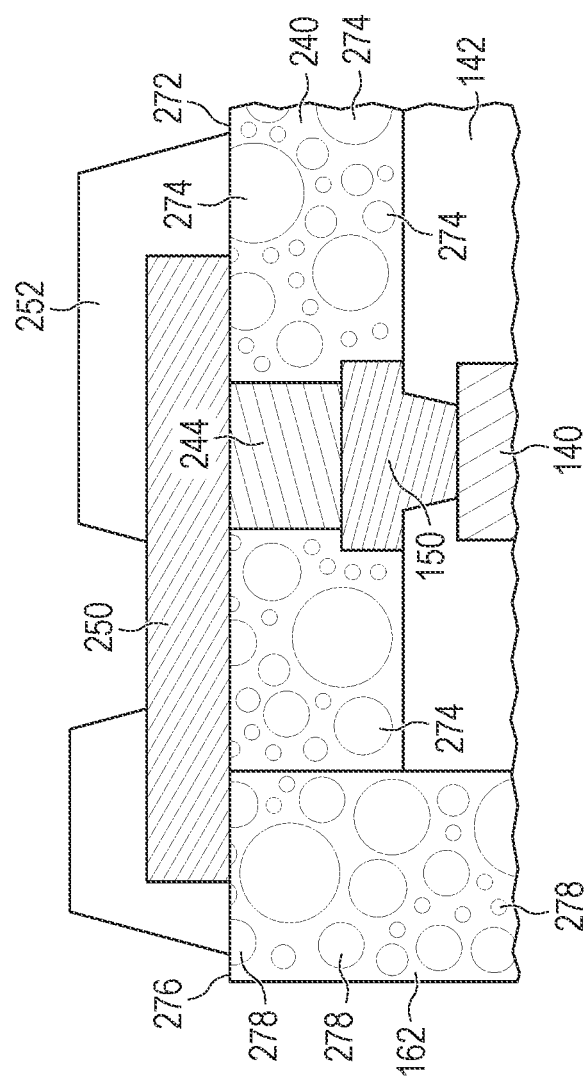
FIG. 7 illustrates further detail of the interconnect structure of the hybrid substrate.

FIG. 7 shows further detail of RDL area 7 from FIG. 6c. Surface 272 of insulating layer undergoes grinding or plasma/chemical etching to planarize the surface and expose filler material 274. Likewise, surface 276 of encapsulant 162 undergoes grinding or plasma/chemical etching to planarize the surface and expose filler material 278.

Figure 8:
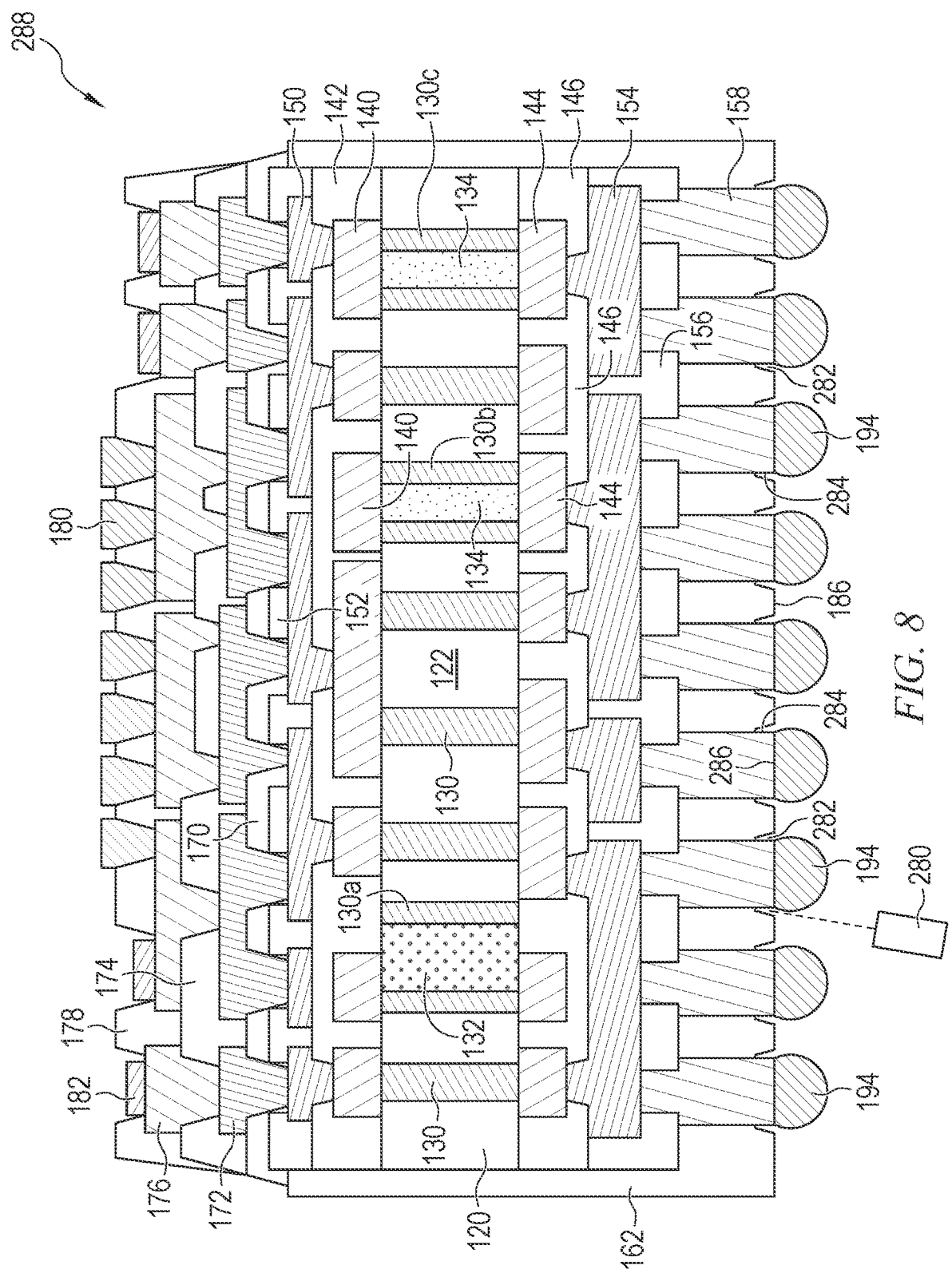
FIG. 8 illustrates a hybrid substrate with vias formed around the conductive pillars.

In another embodiment, similar to FIG. 4b and after backside grinding in FIG. 3d, a portion of encapsulant 162 is removed by LDA using laser 280 to form via 282 around conductive pillars 158, as shown in FIG. 8. Vias 282 extend to a sufficient depth to expose a sidewall of conductive pillars 158. In this case, surface 284 of conductive pillars 158 is below surface 286 of encapsulant 162. The structure shown in FIG. 8 constitutes semiconductor assembly 288.

Figure 9A:
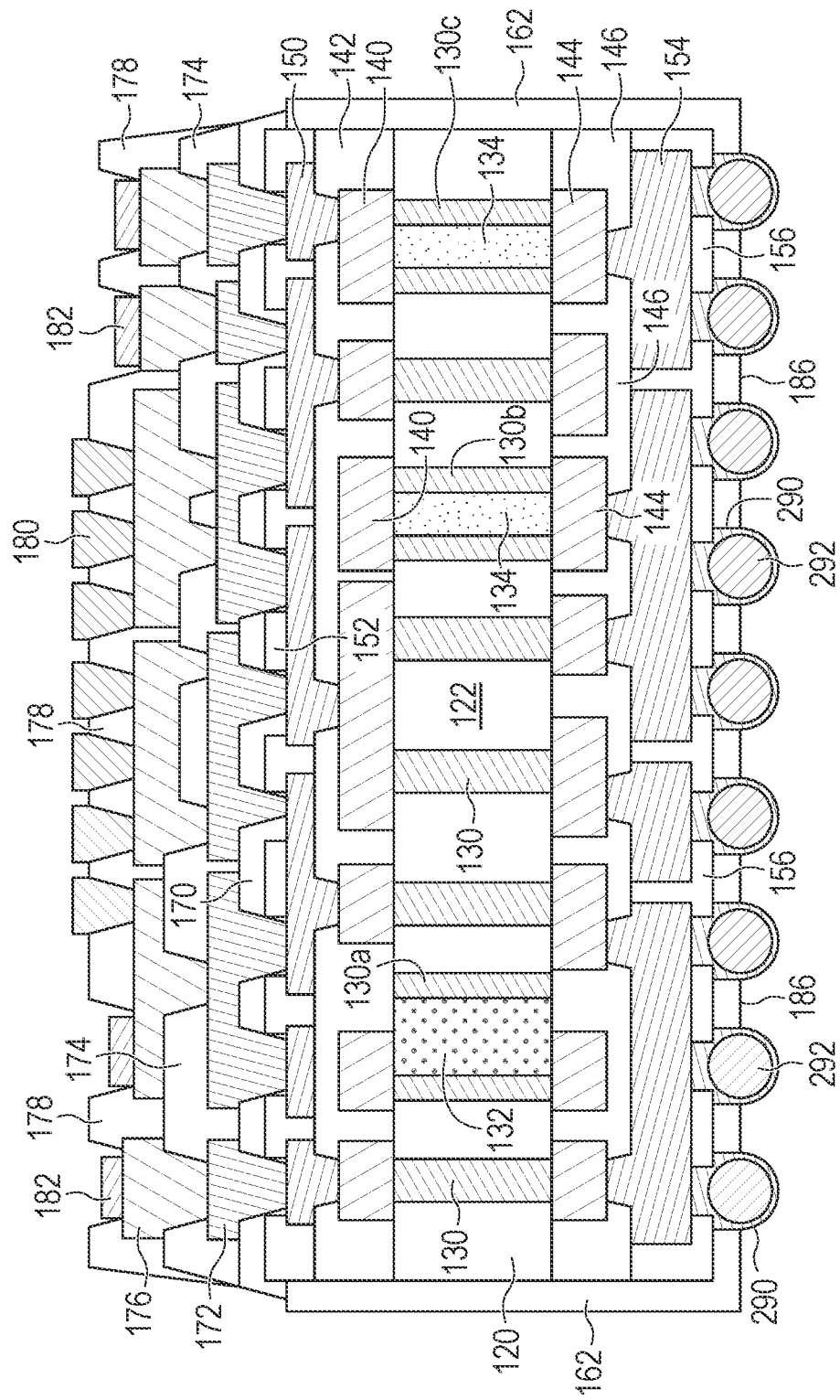
FIGS. 9a-9c illustrate a hybrid substrate with Cu core bumps.

In another embodiment, similar to FIG. 4b minus conductive pillars 158, conductive bump 290 with Cu core 292 is deposited over conductive layer 154, as shown in FIG. 9a. Conductive bump 290 is formed prior to encapsulation 162.

Figure 9B:
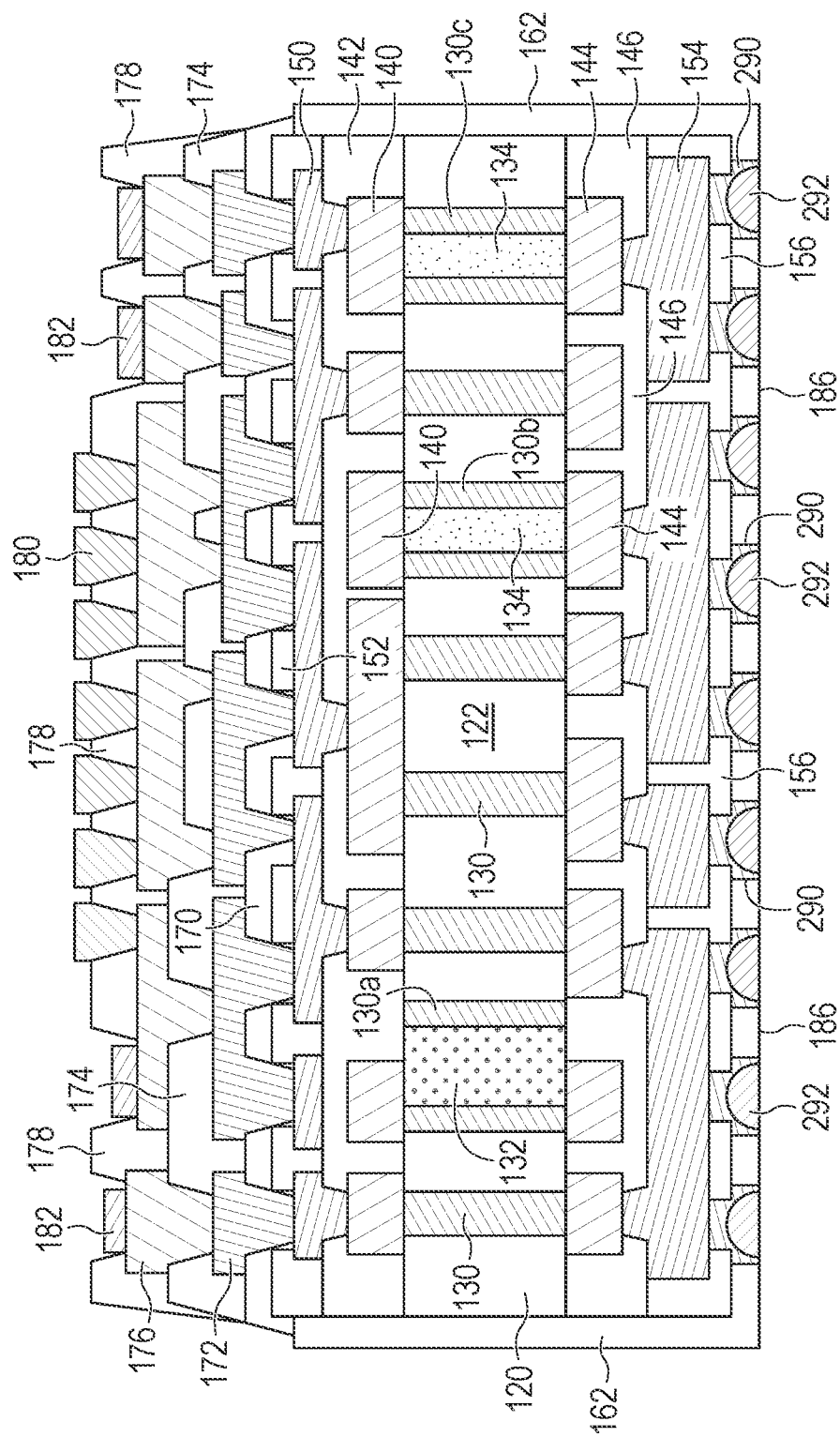
Figure 9C:
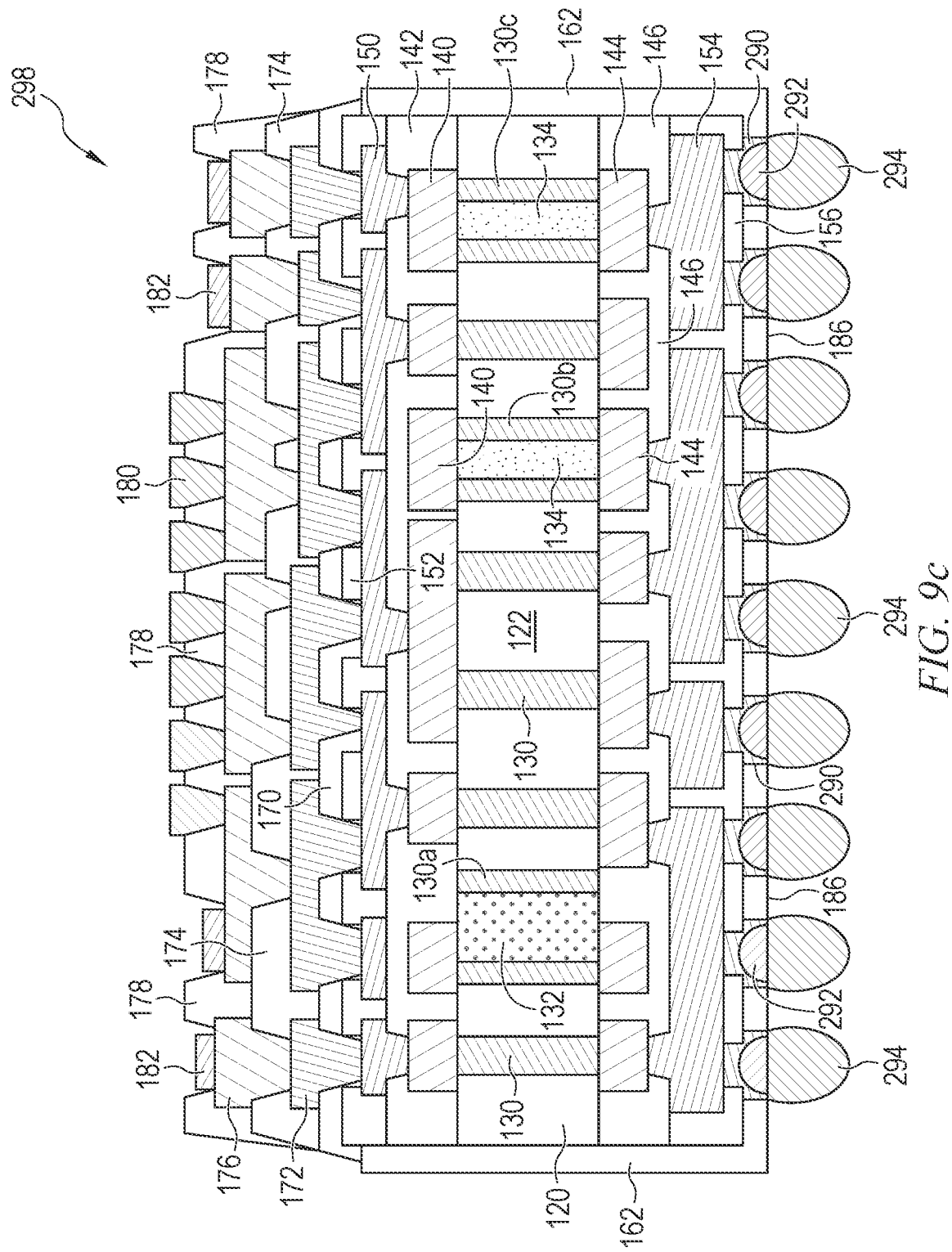

In FIG. 9b, conductive bump 290 undergoes grinding operation to expose Cu core 292, similar to FIG. 3d. In FIG. 9c, solder 294 is deposited over the exposed Cu core. In particular, the grinding operation compensates for variation in thickness of different hybrid substrates. A thinner hybrid substrate has less material removed and a thicker hybrid substrate 160b has more material removed. Non-uniform thickness hybrid substrates pre-encapsulation are made to have uniform thickness hybrid substrates during a grinding operation post encapsulation. Thus, the thickness of various hybrid substrates is made uniform post grinding. The post encapsulation grinding process compensates for variation in hybrid substrate thickness. Encapsulant 162 is planarized and conductive bumps 290 exposed, independent of the variation in thickness of various hybrid substrates. Uniform thickness hybrid substrates contained within semiconductor assembly 298 have good thermal performance and EM performance.

Figure 10:
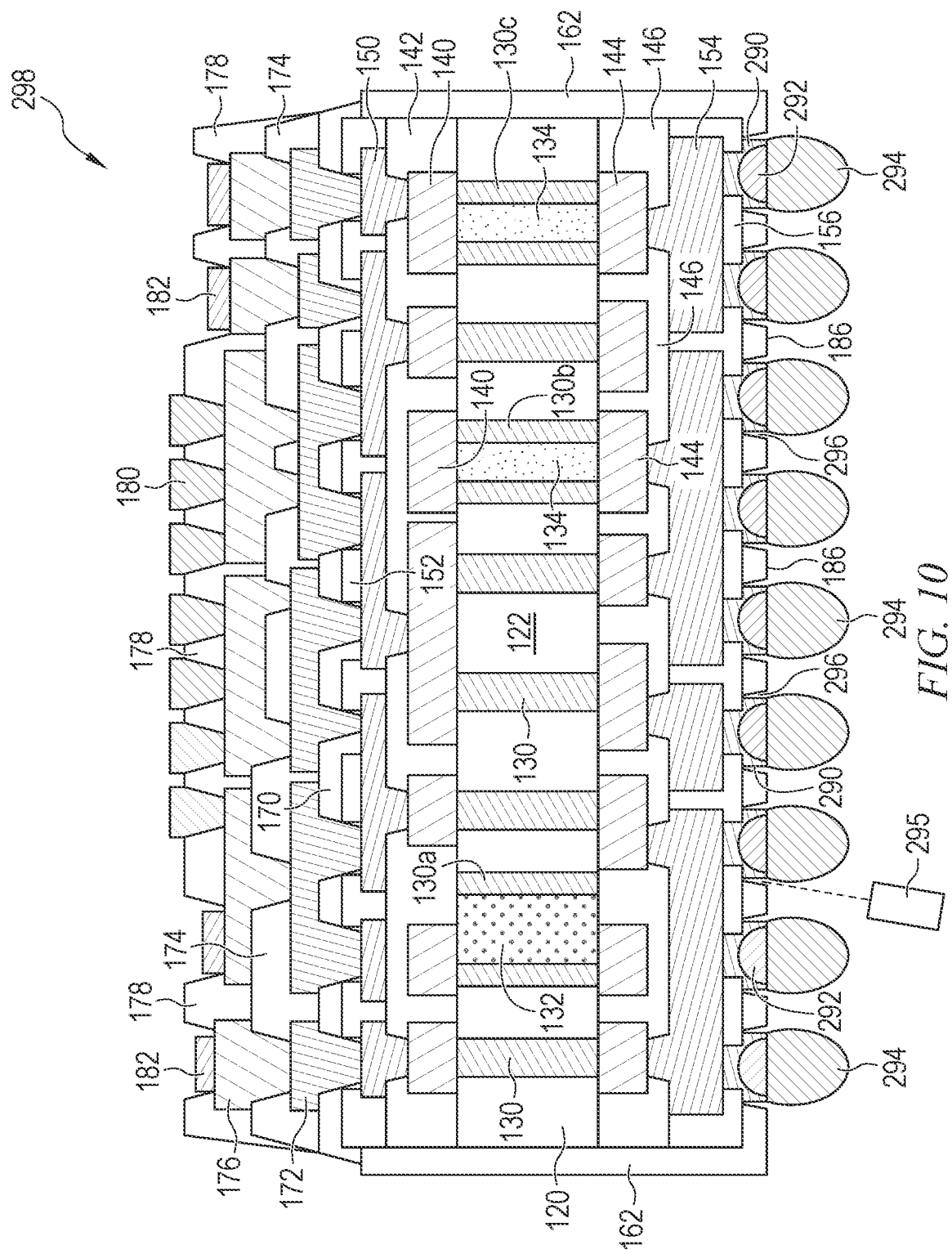
FIG. 10 illustrates a hybrid substrate with vias formed around the Cu core bumps.

In another embodiment, continuing from FIG. 9c, a portion of encapsulant 162 is removed by LDA using laser 295 to form via 296 around conductive bump 290, as shown in FIG. 10.

Figure 11A:
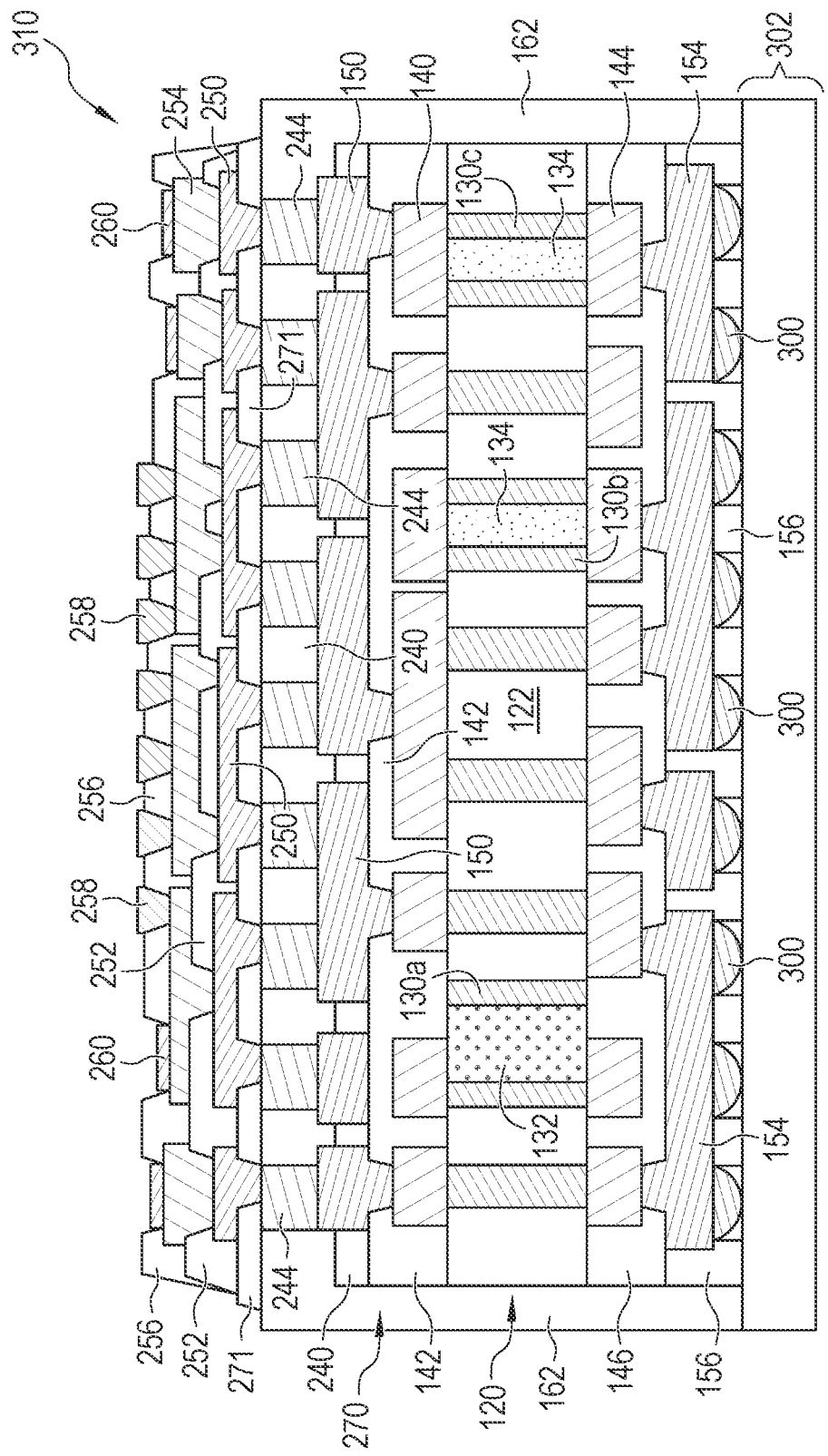
FIGS. 11a-11c illustrate a hybrid substrate with a protective layer formed over the bumps.
Figure 11B:
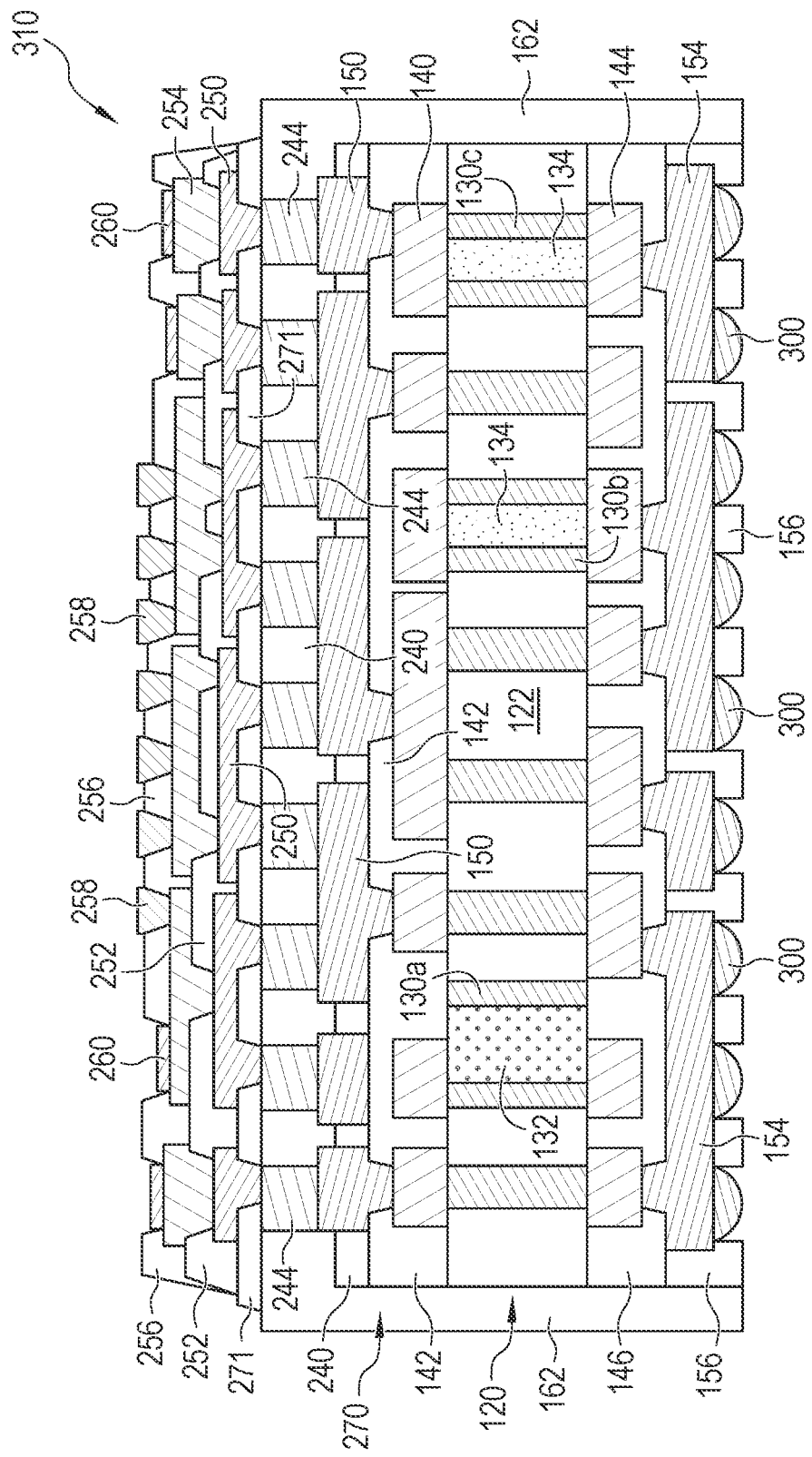
Figure 11C:
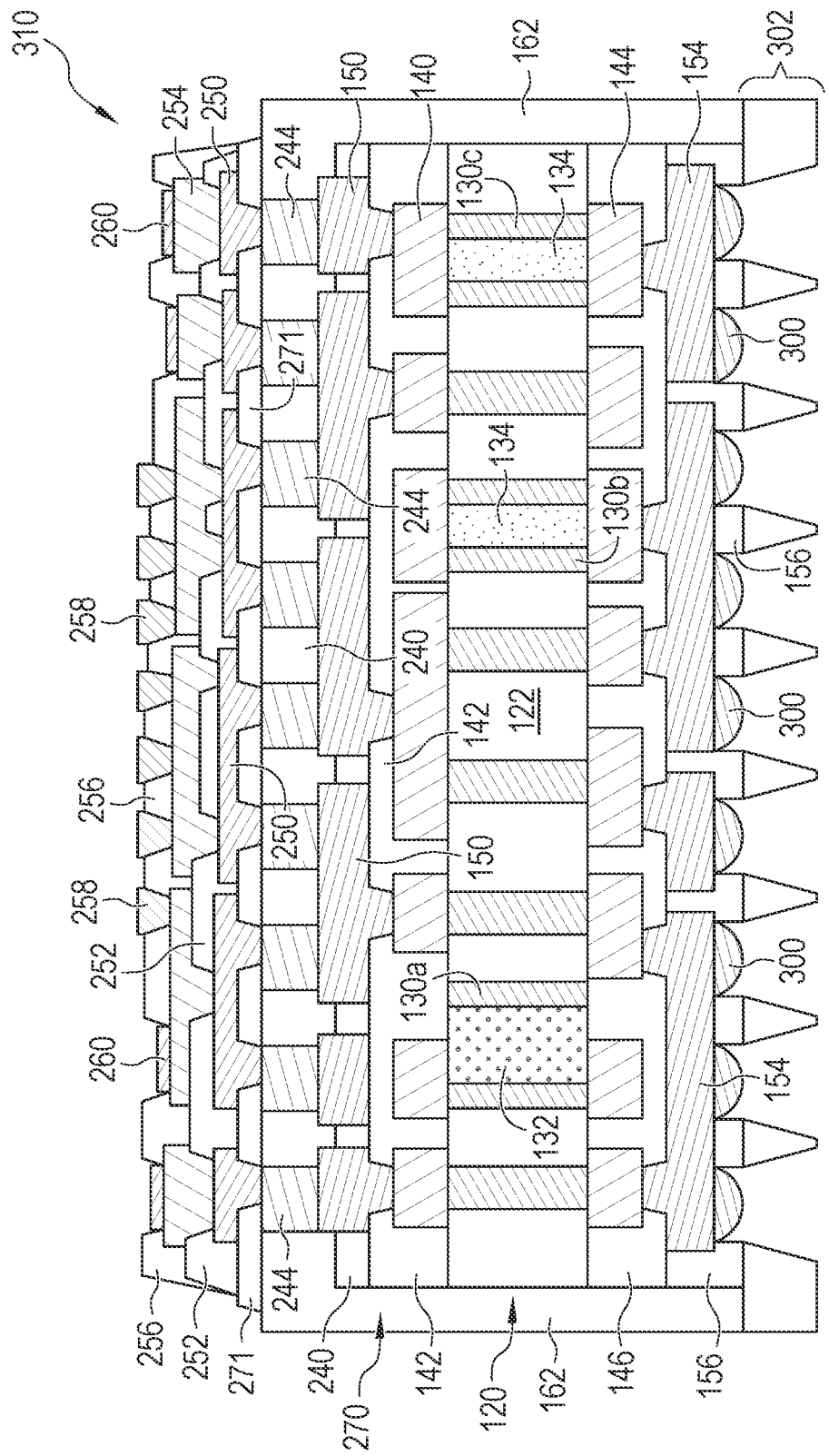

In another embodiment, similar to FIG. 4b minus conductive pillars 158, conductive bumps 300 are deposited over conductive layer 154, as shown in FIG. 11a. Protective layer 302, as single layer or multilayer, is formed over conductive bumps 300. Protective layer 302 protects bumps 300 during redistribution RDL process, provides flat backside surface without vacuum leak during wafer or panel handling, balances wafer or panel warpage during RDL process, and balances unit warpage during following fcBGA assembly process. In FIG. 11b, protective layer 302 is completely removed. Alternatively, protective layer 302 is partially removed using an etching process or LDA to expose conductive bumps 300, as in FIG. 11c.

Figure 12:
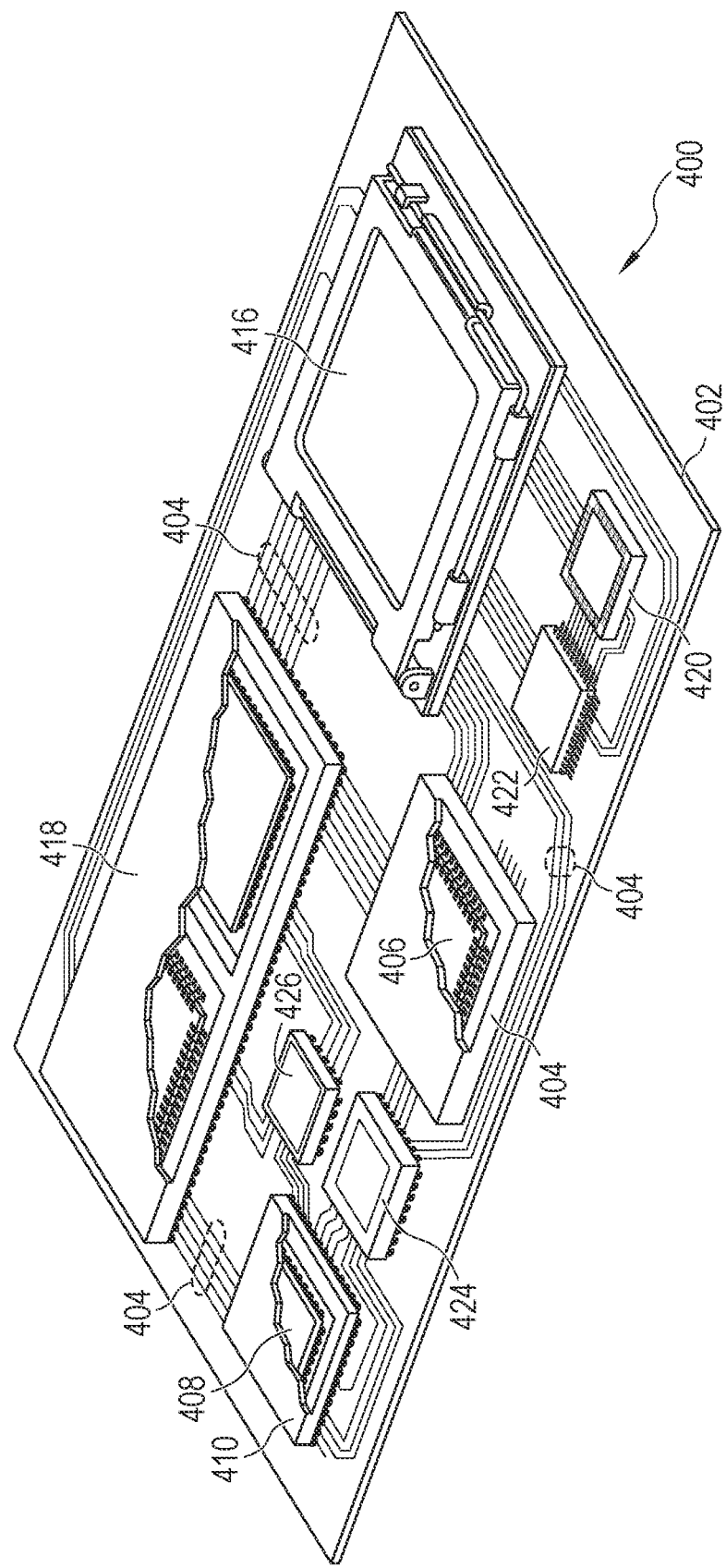
FIG. 12 illustrates a printed circuit board (PCB) with different types of packages disposed on a surface of the PCB.

FIG. 12 illustrates electrical device 400 having a chip carrier substrate or PCB 402 with a plurality of semiconductor packages disposed on a surface of PCB 402, including semiconductor assemblies or packages 190, 266, 288, and 298. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 12, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first hybrid substrate comprising a first thickness;
   providing a second hybrid substrate comprising a second thickness;
   depositing an encapsulant around the first hybrid substrate and second hybrid substrate; and
   removing a portion of the first hybrid substrate and a portion of the second hybrid substrate after encapsulation to achieve a uniform thickness for the first hybrid substate and second hybrid substrate.

2. The method of claim 1, further including removing a portion of the encapsulant.

3. The method of claim 1, wherein the first thickness of the first hybrid substrate is different from the second thickness of the second hybrid substrate.

4. The method of claim 1, wherein providing the first hybrid substrate includes:
   providing an embedded substrate;
   forming a first interconnect structure over a first surface of the embedded substrate; and
   forming a second interconnect structure over a second surface of the embedded substrate opposite the first surface of the embedded substrate.

5. The method of claim 4, further including forming a plurality of conductive pillars over the first interconnect structure.

6. The method of claim 4, further including forming a plurality of conductive vias through the embedded substrate.

7. A method of making a semiconductor device, comprising:
   providing a first hybrid substrate comprising a first thickness;
   depositing an encapsulant around the first hybrid substrate; and
   removing a portion of the first hybrid substrate after encapsulation to achieve a uniform thickness for the first hybrid substate.

8. The method of claim 7, further including:
   providing a second hybrid substrate comprising a second thickness;
   depositing the encapsulant around the second hybrid substrate; and
   removing a portion of the second hybrid substrate to achieve uniform thickness for the first hybrid substate and second hybrid substrate.

9. The method of claim 8, wherein the first thickness of the first hybrid substrate is different from the second thickness of the second hybrid substrate.

10. The method of claim 7, further including removing a portion of the encapsulant.

11. The method of claim 7, wherein providing the first hybrid substrate includes:
    providing an embedded substrate;
    forming a first interconnect structure over a first surface of the embedded substrate; and
    forming a second interconnect structure over a second surface of the embedded substrate opposite the first surface of the embedded substrate.

12. The method of claim 11, further including forming a plurality of conductive pillars over the first interconnect structure.

13. The method of claim 11, further including forming a plurality of conductive vias through the embedded substrate.

14. A method of making a semiconductor device, comprising:
    providing a first hybrid substrate;
    providing a second hybrid substrate; and
    depositing an encapsulant around the first hybrid substrate and second hybrid substrate; and
    removing a portion of the first hybrid substrate and a portion of the second hybrid substrate to achieve a uniform thickness for the first hybrid substate and second hybrid substrate.

15. The method of claim 14, wherein a first thickness of the first hybrid substrate is different from a second thickness of the second hybrid substrate.

16. The method of claim 14, wherein the first hybrid substrate includes:
    providing an embedded substrate;
    forming a first interconnect structure over a first surface of the embedded substrate; and
    forming a second interconnect structure over a second surface of the embedded substrate opposite the first surface of the embedded substrate.

17. The method of claim 16, further including forming a plurality of conductive pillars over the first interconnect structure.

18. The method of claim 16, further including forming a plurality of conductive vias through the embedded substrate.

19. The method of claim 18, further including disposing a core material within a first conductive via of the plurality of the conductive vias.

20. A method of making a semiconductor device, comprising:
    providing a first hybrid substrate;
    depositing an encapsulant around the first hybrid substrate; and
    removing a portion of the first hybrid substrate to achieve a uniform thickness for the first hybrid substate.

21. The method of claim 20, further including:
    providing a second hybrid substrate;
    depositing the encapsulant around the second hybrid substrate; and
    removing a portion of the second hybrid substrate to achieve a uniform thickness for the first hybrid substate and second hybrid substrate.

22. The method of claim 21, wherein a first thickness of the first hybrid substrate is difference from a second thickness of the second hybrid substrate.

23. The method of claim 20, wherein providing the first hybrid substrate includes:
    providing an embedded substrate;
    forming a first interconnect structure over a first surface of the embedded substrate; and
    forming a second interconnect structure over a second surface of the embedded substrate opposite the first surface of the embedded substrate.

24. The method of claim 23, further including forming a plurality of conductive pillars over the first interconnect structure.

25. The method of claim 23, further including forming a plurality of conductive vias through the embedded substrate.

* * * * *

UNITED STATES PATENT AND TRADEMARK OFFICE
CERTIFICATE OF CORRECTION

PATENT NO. : 12,381,141 B2
APPLICATION NO. : 17/823827
DATED : August 5, 2025
INVENTOR(S) : Yaojian Lin et al.

Page 1 of 1

It is certified that error appears in the above-identified patent and that said Letters Patent is hereby corrected as shown below:

In the Claims

Column 14, Claim 22, Line 39, replace the word "difference" with the word --different--.

Signed and Sealed this
Second Day of September, 2025

Coke Morgan Stewart
*Acting Director of the United States Patent and Trademark Office*